(12) United States Patent
Chang et al.

(10) Patent No.: US 12,740,166 B2
(45) Date of Patent: Sep. 15, 2026

(54) IMAGE SENSOR AND ELECTRONIC SYSTEM INCLUDING THE SAME

(71) Applicant: SAMSUNG ELECTRONICS CO., LTD., Suwon-si (KR)

(72) Inventors: Kyoungeun Chang, Suwon-si (KR); Sungin Kim, Suwon-si (KR); Seonghoon Ko, Suwon-si (KR); Donghyun Kim, Suwon-si (KR); Wook Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 655 days.

(21) Appl. No.: 18/093,609

(22) Filed: Jan. 5, 2023

(65) Prior Publication Data

US 2023/0343800 A1 Oct. 26, 2023

(30) Foreign Application Priority Data

Apr. 20, 2022 (KR) ........................ 10-2022-0049165

(51) Int. Cl.
*H10F 39/00* (2025.01)
*H10F 39/18* (2025.01)

(52) U.S. Cl.
CPC ..... *H10F 39/80373* (2025.01); *H10F 39/014* (2025.01); *H10F 39/18* (2025.01); *H10F 39/807* (2025.01)

(58) Field of Classification Search
None
See application file for complete search history.

(56) References Cited

U.S. PATENT DOCUMENTS 7,364,960 B2 4/2008 Lyu
7,863,658 B2 1/2011 Ho et al.
8,809,990 B2 8/2014 Maeda et al.
(Continued)

FOREIGN PATENT DOCUMENTS

EP 4 376 083 A1 5/2024
JP 2022010457 A 1/2022
(Continued)

OTHER PUBLICATIONS

Communication dated Jul. 21, 2023 issued by the European Patent Office in counterpart European Application No. 23166206.5.
(Continued)

*Primary Examiner* — Christine S. Kim
*Assistant Examiner* — Andrew Victor Prostor
(74) *Attorney, Agent, or Firm* — Sughrue Mion, PLLC

(57) ABSTRACT

An image sensor includes a substrate having a pixel region in which an active region having a locally asymmetric fin region limited by a locally cutout space is defined and a transistor provided in the pixel region. The transistor includes a horizontal gate portion provided on the active region and a vertical gate portion filling the locally cutout space and facing one of fin sidewalls of the locally asymmetric fin region. Distances of the source region and drain region formed in the active region from the locally asymmetric fin region are different from each other. An electronic system includes at least one camera module including an image sensor and a processor configured to process image data provided from the at least one camera module.

20 Claims, 31 Drawing Sheets

(56) References Cited

U.S. PATENT DOCUMENTS

| | | | |
|---|---|---|---|
| 9,443,900 | B2 | 9/2016 | Yamashita |
| 10,600,828 | B2 | 3/2020 | Kudoh |
| 11,412,166 | B2 | 8/2022 | Fujita et al. |
| 2007/0034965 | A1 | 2/2007 | Jung et al. |
| 2011/0086459 | A1 | 4/2011 | Ho et al. |
| 2018/0069041 | A1 | 3/2018 | Milic-Strkalj |
| 2018/0102392 | A1* | 4/2018 | Hwang ............ H10F 39/80373 |
| 2018/0182795 | A1 | 6/2018 | Kim et al. |
| 2020/0135777 | A1 | 4/2020 | Zhao et al. |
| 2020/0350358 | A1 | 11/2020 | Watanabe et al. |
| 2021/0193715 | A1 | 6/2021 | McCarten |
| 2021/0266482 | A1 | 8/2021 | Ammo |
| 2021/0305298 | A1 | 9/2021 | Hu et al. |
| 2021/0320139 | A1 | 10/2021 | Sze et al. |
| 2022/0181364 | A1 | 6/2022 | Miyake et al. |
| 2023/0299162 | A1* | 9/2023 | Yamachi ........... H10F 39/80373 257/443 |

FOREIGN PATENT DOCUMENTS

| | | | |
|---|---|---|---|
| KR | 1020060034926 | A | 4/2006 |
| KR | 100644019 | B1 | 11/2006 |
| KR | 10-2012-0047368 | A | 5/2012 |
| KR | 1020130058402 | A | 6/2013 |
| KR | 10-2018-0000933 | A | 1/2018 |
| KR | 10-2018-0038148 | A | 4/2018 |
| KR | 1020200126477 | A | 11/2020 |
| KR | 1020210141935 | A | 11/2021 |
| KR | 10-2022-0045476 | A | 4/2022 |

OTHER PUBLICATIONS

Communication issued Sep. 25, 2025 by the Korean Intellectual Property Office in counterpart Korean Patent Application No. 10-2022-0049165.

Communication dated Jun. 11, 2026, issued by the European Patent Office in counterpart European Application No. 23166206.5.

* cited by examiner

IMAGE SENSOR AND ELECTRONIC SYSTEM INCLUDING THE SAME

CROSS-REFERENCE TO RELATED APPLICATION

This application is based on and claims priority from Korean Patent Application No. 10-2022-0049165, filed on Apr. 20, 2022, in the Korean Intellectual Property Office, the disclosure of which is incorporated by reference herein in its entirety.

BACKGROUND

1. Field

The example embodiments of the disclosure relates to an image sensor and an electronic system including the image sensor, and more particularly, to an image sensor including a transistor and an electronic system including the image sensor.

2. Description of Related Art

Image sensors that capture images and convert the captured images into electrical signals have been used in various fields, such as digital cameras, camcorders, personal communication systems (PCS), game devices, security cameras, and medical micro-cameras, with the development of the computer industry and communications industry. According to the high integration of image sensors and the miniaturization of a pixel size, there is demand for an image sensor including a transistor having a structure for securing stable electrical characteristics.

SUMMARY

One or more aspect of the disclosure provides an image sensor having a structure capable of improving noise characteristics of pixels and securing electrical characteristics of a transistor even when the image sensor is highly integrated and a pixel size is miniaturized.

One or more aspect of the disclosure also provides an electronic system including an image sensor having a structure capable of improving noise characteristics of pixels and securing electrical characteristics of a transistor even when the image sensor is highly integrated and a pixel size is miniaturized.

According to an aspect of the disclosure, there is provided an image sensor including: a substrate having a pixel region; an active region in the pixel region, the active region having an asymmetric fin region configured by a cutout space in the active region; and a transistor provided in the pixel region, wherein the transistor includes: a gate electrode including: a horizontal gate portion provided on the active region and having a first surface facing an upper surface of the active region, and a vertical gate portion filling the cutout space and having a second surface facing a fin sidewall among a plurality of fin sidewalls of the asymmetric fin region; a source region and a drain region formed in the active region, the source region being formed on a first side of the gate electrode and the drain region formed on a second side of the gate electrode opposite to the first side; and a gate dielectric layer provided between the active region and the gate electrode, wherein a first distance between the source region and the asymmetric fin region is different from a second distance between the drain region and the asymmetric fin region.

The first distance may be a distance from the asymmetric fin region to the source region in a channel direction in the active region, and the second distance may be a distance from the asymmetric fin region to the drain region in the channel direction in the active region, and wherein the first distance may be smaller than the second distance.

The active region may have two edge portions in a direction perpendicular to a channel direction in the active region, and wherein the cutout space may be formed in only one of the two edge portions.

The horizontal gate portion of the gate electrode may be provided on a fin upper surface of the asymmetric fin region, the vertical gate portion of the gate electrode may be provided on a first fin sidewall, among the fin sidewalls of the asymmetric fin region, facing the cutout space, and a device isolation insulating structure may be provided on a second fin sidewall on an opposite side of the first fin sidewall, among the fin sidewalls.

The active region may have a rectangular planar shape such that a length of the active region in a first horizontal direction is longer than a width of the active region in a second horizontal direction perpendicular to the first horizontal direction, the source region may be provided at one end of the active region in the first horizontal direction, the drain region may be provided at another end of the active region in the first horizontal direction, and the asymmetric fin region may be closer to the source region than to the drain region in the active region.

The active region may have an L-shaped planar shape including a bent portion, the transistor may be configured such that a channel is formed in a direction bent along the planar shape of the active region, the source region may be provided at one end of the active region, the drain region may be provided at another end of the active region, and the asymmetric fin region may be closer to the source region than to the drain region in the active region.

In a top view of the substrate, the active region may have an inner edge portion connected to an inner side of the bent portion and an outer edge portion connected to an outer side of the bent portion, the cutout space may be formed in the inner edge portion of the active region, and another fin sidewall, among the fin sidewalls of the asymmetric fin region, may configure the outer edge portion of the active region.

The transistor may include a dual transistor in which two local transistors sharing the source region are connected in parallel, the drain region may include a first drain region provided at one end of the active region and a second drain region provided at another end of the active region, and the asymmetric fin region may include a first asymmetric fin region provided in a first position closer to the source region between the source region and the first drain region, and a second asymmetric fin region provided in a second position closer to the source region between the source region and the second drain region.

The horizontal gate portion of the gate electrode may be provided on an upper surface of each of the first asymmetric fin region and the second asymmetric fin region, and the vertical gate portion of the gate electrode may include: a first vertical gate portion integrally connected to the horizontal gate portion and having a surface facing a first fin sidewall of the first asymmetric fin region; and a second vertical gate portion integrally connected to the horizontal gate portion and having a surface facing a second fin sidewall of the second asymmetric fin region.

The transistor may include a first gate electrode provided between the source region and the first drain region, and a second gate electrode provided between the source region and the second drain region, and wherein the first gate electrode and the second gate electrode may be spaced apart from each other with the source region provided between the first gate electrode and the second gate electrode.

The transistor may include a dual transistor in which two local transistors sharing the source region are connected in parallel, the active region has an L-shaped planar shape may include a bent portion, and in a top view, the active region may include an inner edge portion connected to an inner side of the bent portion and an outer edge portion connected to an outer side of the bent portion, the drain region may include a first drain region provided at one end of the active region, and a second drain region provided at the other end of the active region, and the asymmetric fin region may include: a first asymmetric fin region provided between the source region and the first drain region and closer to the source region than the first drain region in a first position closer to the inner edge portion than the outer edge portion of the active region; and a second asymmetric fin region provided between the source region and the second drain region and closer to the source region than the second drain region in a second position closer to the inner edge portion than the outer edge portion of the active region.

According to another aspect of the disclosure, there is provided an image sensor including: a substrate having a pixel region; an active region provided in the pixel region, the active region having a asymmetric fin region configured by a locally cutout space; and a source follower transistor provided in the pixel region, wherein the source follower transistor may include: a gate electrode including: a horizontal gate portion provided on the active region and having a first surface facing a frontside surface of the substrate; and a vertical gate portion filling the cutout space and having a second surface facing a fin sidewall, among a plurality of fin sidewalls of the asymmetric fin region, and a third surface at a vertical level lower than a vertical level of the frontside surface of the substrate; a source region and a drain region formed in the active region, the source region being formed on a first side of the gate electrode and the drain region formed on a second side of the gate electrode opposite to the first side; and a gate dielectric layer provided between the active region and the gate electrode, the gate dielectric layer comprising portions in contact with the third surface of the vertical gate portion and the fin sidewall, and wherein a first distance from the asymmetric fin region to the source region in a channel direction in the active region is smaller than a second distance from the asymmetric fin region to the drain region in the channel direction.

The image sensor may further include a photodiode formed in the substrate, wherein the cutout space and the asymmetric fin region overlap the photodiode in a vertical direction.

The asymmetric fin region of the active region may be provided in a position shifted from a center of the active region to an edge side of the active region in a direction perpendicular to the channel direction in the active region.

An uppermost surface of the active region may have a variable width in the channel direction in the active region, and the width of the uppermost surface of the active region is the smallest in the asymmetric fin region.

The active region may have a rectangular planar shape such that a length of the active region in a first horizontal direction is longer than a width of the active region in a second horizontal direction perpendicular to the first horizontal direction, the source region may be provided at one end of the active region in the first horizontal direction, and the drain region may be provided at another end of the active region in the first horizontal direction.

The active region may have an L-shaped planar shape comprising a bent portion, the transistor may be configured such that a channel is formed in a direction bent along the planar shape of the active region, the source region may be provided at one end of the active region, the drain region may be provided at another end of the active region, and the horizontal gate portion of the gate electrode may be provided on the bent portion of the active region, and the vertical gate portion of the gate electrode is horizontally spaced apart from the bent portion of the active region.

The transistor may include a dual transistor in which two local transistors sharing the source region are connected in parallel, the drain region comprises a first drain region provided at one end of the active region, and a second drain region provided at the other end of the active region, and the asymmetric fin region comprises a first asymmetric fin region provided in a first position closer to the source region between the source region and the first drain region, and a second asymmetric fin region provided in a second position closer to the source region between the source region and the second drain region.

The transistor may include a dual transistor in which two local transistors sharing the source region are connected in parallel, the active region has an L-shaped planar shape may include a bent portion, the source region is provided in the bent portion of the active region; the drain region may include a first drain region provided at one end of the active region, and a second drain region provided at another end of the active region, and the asymmetric fin region may include: a first asymmetric fin region provided in a first position closer to the source region than the first drain region between the source region and the first drain region, and a second asymmetric fin region provided in a second position closer to the source region than the second drain region between the source region and the second drain region.

According to another aspect of the disclosure, there is provided an electronic system including: at least one camera including an image sensor; and a processor configured to process image data received from the at least one camera, wherein the image sensor includes: a substrate having a pixel region; an active region provided in the pixel region, the active region having an asymmetric fin region configured by a cutout space in the active region; and a transistor provided in the pixel region, wherein the transistor includes: a gate electrode comprising a horizontal gate portion provided on the active region and having a first surface facing an upper surface of the active region, and a vertical gate portion filling the cutout space and having a second surface facing a fin sidewall among a plurality of fin sidewalls of the asymmetric fin region; a source region and a drain region formed in the active region, the source region being formed on a first side of the gate electrode and the drain region formed on a second side of the gate electrode opposite to the first side; and a gate dielectric layer between the active region and the gate electrode, and wherein a first distance between the source region and the asymmetric fin region is different from a second distance between the drain region and the asymmetric fin region.

According to another aspect of the disclosure, there is provided a semiconductor device including: an active region having an asymmetric fin region configured by a cutout space in the active region; and a gate electrode including: a horizontal gate portion provided on the active region, and a vertical gate portion filling the cutout space; a source region provided on a first side of the gate electrode; a drain region provide on a second side of the gate electrode opposite to the first side; and a gate dielectric layer provided between the active region and the gate electrode, wherein a first distance between the source region and the asymmetric fin region is different from a second distance between the drain region and the asymmetric fin region.

BRIEF DESCRIPTION OF DRAWINGS

Embodiments of the disclosure will be more clearly understood from the following detailed description taken in conjunction with the accompanying drawings in which.

DETAILED DESCRIPTION OF EMBODIMENTS

Figure 1:
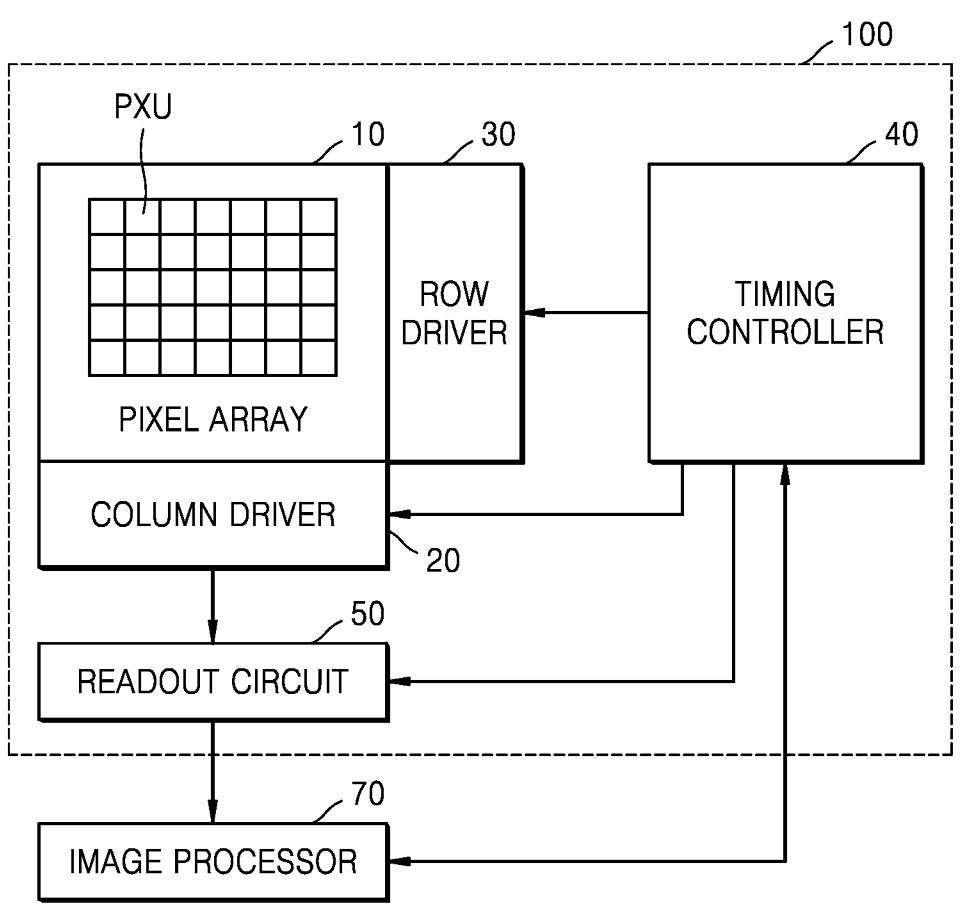
FIG. 1 is a block diagram illustrating an image sensor according to example embodiments of the disclosure.

Hereinafter, example embodiments of the disclosure are described in detail with reference to the accompanying drawings. The same reference numerals are used for the same components in the drawings, and redundant descriptions thereof are omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

FIG. 1 is a block diagram illustrating an image sensor 100 according to example embodiments of the disclosure.

Referring to FIG. 1, the image sensor 100 according to example embodiments of the disclosure may include a pixel array 10 and circuits for controlling the pixel array 10. According to an example embodiment, the circuits for controlling the pixel array 10 may include a column driver 20, a row driver 30, a timing controller 40, and a readout circuit 50.

The image sensor 100 may operate according to a control command received from an image processor 70, may convert light transmitted from an external object into an electrical signal, and may output the electrical signal to the image processor 70. The image sensor 100 may be a complementary metal-oxide-semiconductor (CMOS) image sensor.

The pixel array 10 may include a plurality of unit pixels PXU having a two-dimensional (2D) array structure arranged in a matrix form along a plurality of row lines and a plurality of column lines.

Each of the unit pixels PXU may include a photodiode. The photodiode may generate electric charge by receiving light from the object. The image sensor 100 may perform an autofocus function by using a phase difference between pixel signals generated from a plurality of photodiodes included in the unit pixels PXU. Each of the unit pixels PXU may include a pixel circuit for generating a pixel signal from charges generated by the photodiode.

The column driver 20 may include a correlated double sampler (CDS), an analog-to-digital converter (ADC), and the like. The CDS may be connected to unit pixels PXU included in a row selected by a row select signal supplied by the row driver 30 through column lines, and may perform correlated double sampling to detect a reset voltage and a pixel voltage. The ADC may convert the reset voltage and the pixel voltage detected by the CDS into digital signals and may transfer the digital signals to the readout circuit 50.

The readout circuit 50 may include a latch or buffer circuit capable of temporarily storing a digital signal, an amplifier circuit, etc., and may temporarily store the digital signals received from the column driver 20 or amplify the digital signals to generate image data. Operation timings of the column driver 20, the row driver 30, and the readout circuit 50 may be determined by the timing controller 40, and the timing controller 40 may be operated by a control command transmitted from the image processor 70.

The image processor 70 may signal-process the image data output from the readout circuit 50 and output the signal-processed image data to a display device or store the signal-processed image data in a storage device, such as a memory. When the image sensor 100 is mounted on an autonomous vehicle, the image processor 70 may signal-process the image data and transmit the signal-processed image data to a main controller that controls the autonomous vehicle.

Figure 2:
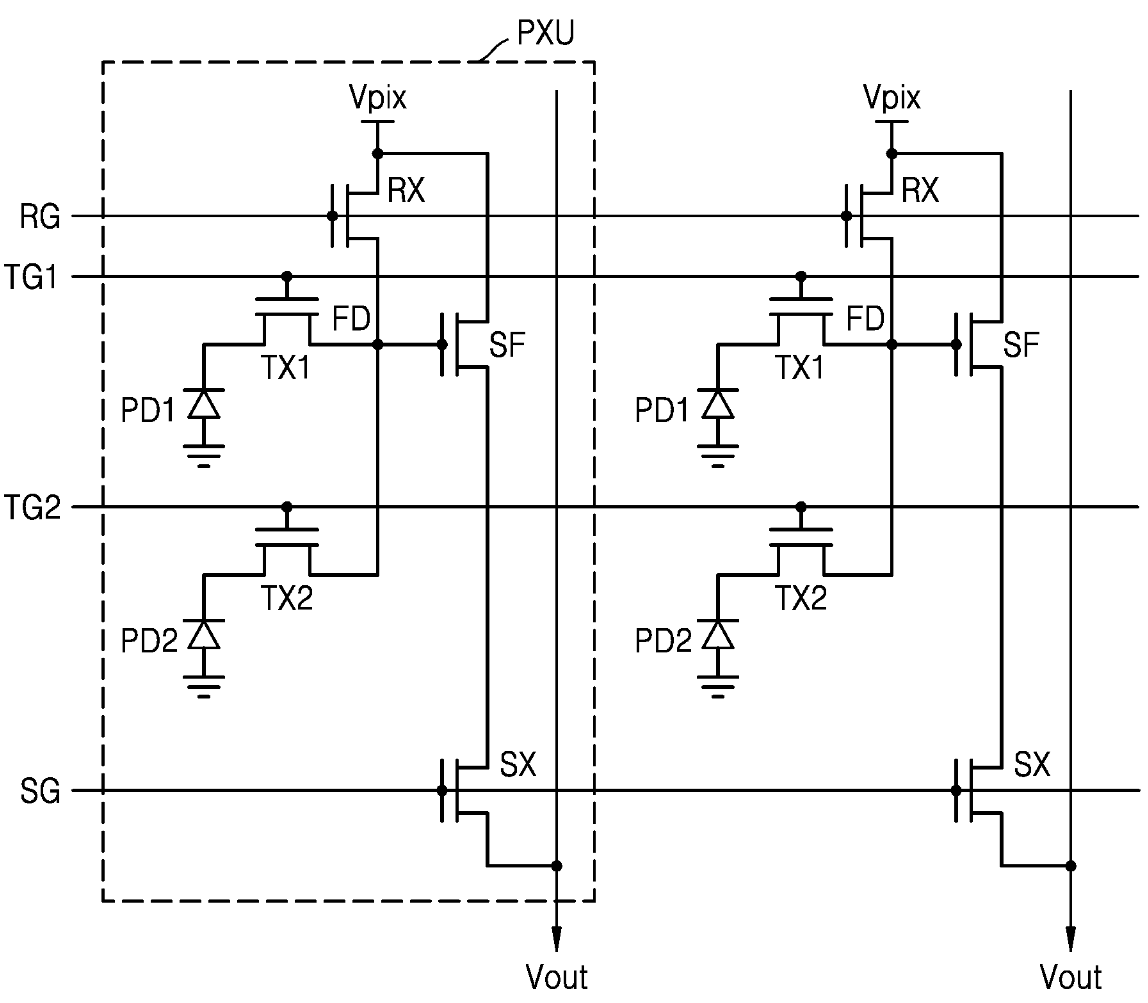
FIG. 2 is a circuit diagram of a unit pixel that may be included in an image sensor according to example embodiments of the disclosure.

FIG. 2 illustrates a circuit diagram of the unit pixel PXU that may be included in the image sensor 100 according to example embodiments of the disclosure.

Referring to FIG. 2, each of the unit pixels PXU included in the pixel array 10 of the image sensor 100 illustrated in FIG. 1 may be configured as a 2-shared pixel including two photodiodes, i.e., first and second photodiodes PD1 and PD2.

In the unit pixel PXU, the first and second photodiodes PD1 and PD2 may share one floating diffusion region FD through first and second transfer transistors TX1 and TX2. That is, the first transfer transistor TX1 corresponding to the first photodiode PD1 and the second transfer transistor TX2 corresponding to the second photodiode PD2 may share one floating diffusion region FD as a common drain region.

In one unit pixel PXU, the first and second photodiodes PD1 and PD2 may share the reset transistor RX, a source follower transistor SF, and a selection transistor SX. Gate electrodes of the reset transistor RX, the first and second transfer transistors TX1 and TX2, and the selection transistor SX may be connected to driving signal lines RG, TG1, TG2, and SG. The first and second photodiodes PD1 and PD2 may configure source regions of the first and second transfer transistors TX1 and TX2, respectively. The floating diffusion region FD may configure a common drain region of the first and second transfer transistors TX1 and TX2. The floating diffusion region FD may be connected to each of a source region of the reset transistor RX and a gate electrode of the source follower transistor SF. A drain region of the reset transistor RX and a drain region of the source follower transistor SF may be connected to a power supply voltage Vpix. A source region of the source follower transistor SF and a drain region of the selection transistor SX may be shared with each other. An output voltage Vout may be connected to a source region of the selection transistor SX.

The first and second photodiodes PD1 and PD2 may generate and accumulate photocharges in proportion to the amount of externally incident light. The gate electrodes of the first and second transfer transistors TX1 and TX2 may transmit charges accumulated in the first and second photodiodes PD1 and PD2 to the floating diffusion region FD. Complementary signals may be applied to the gate electrodes of the first and second transfer transistors TX1 and TX2 from the driving signal lines TG1 and TG2, and charges may be transferred from any one of the first and second photodiodes PD1 and PD2 to the floating diffusion region FD. The floating diffusion region FD may receive and store photocharges generated by the first and second photodiodes PD1 and PD2.

The floating diffusion region FD may be periodically reset by the reset transistor RX. When the reset transistor RX is turned on by the reset signal, the power supply voltage Vpix connected to the reset transistor RX may be transferred to the floating diffusion region FD, and the charges accumulated in the floating diffusion region FD may be discharged, and the floating diffusion region FD may be reset.

The gate electrode of the source follower transistor SF may be connected to the floating diffusion region FD. The source follower transistor SF may serve as a source follower buffer amplifier and may amplify a change in an electrical potential of the floating diffusion region FD. The pixel signal amplified by the source follower transistor SF may be output to an output line through the selection transistor SX. The drain of the source follower transistor SF may be connected to the power supply voltage Vpix, and the source of the source follower transistor SF may be connected to the drain of the selection transistor SX.

The selection transistor SX may select a unit pixel PXU to be read in rows. When the selection transistor SX is turned on, the power supply voltage Vpix connected to the drain of the source follower transistor SF may be transferred to the drain of the selection transistor SX.

Figure 3:
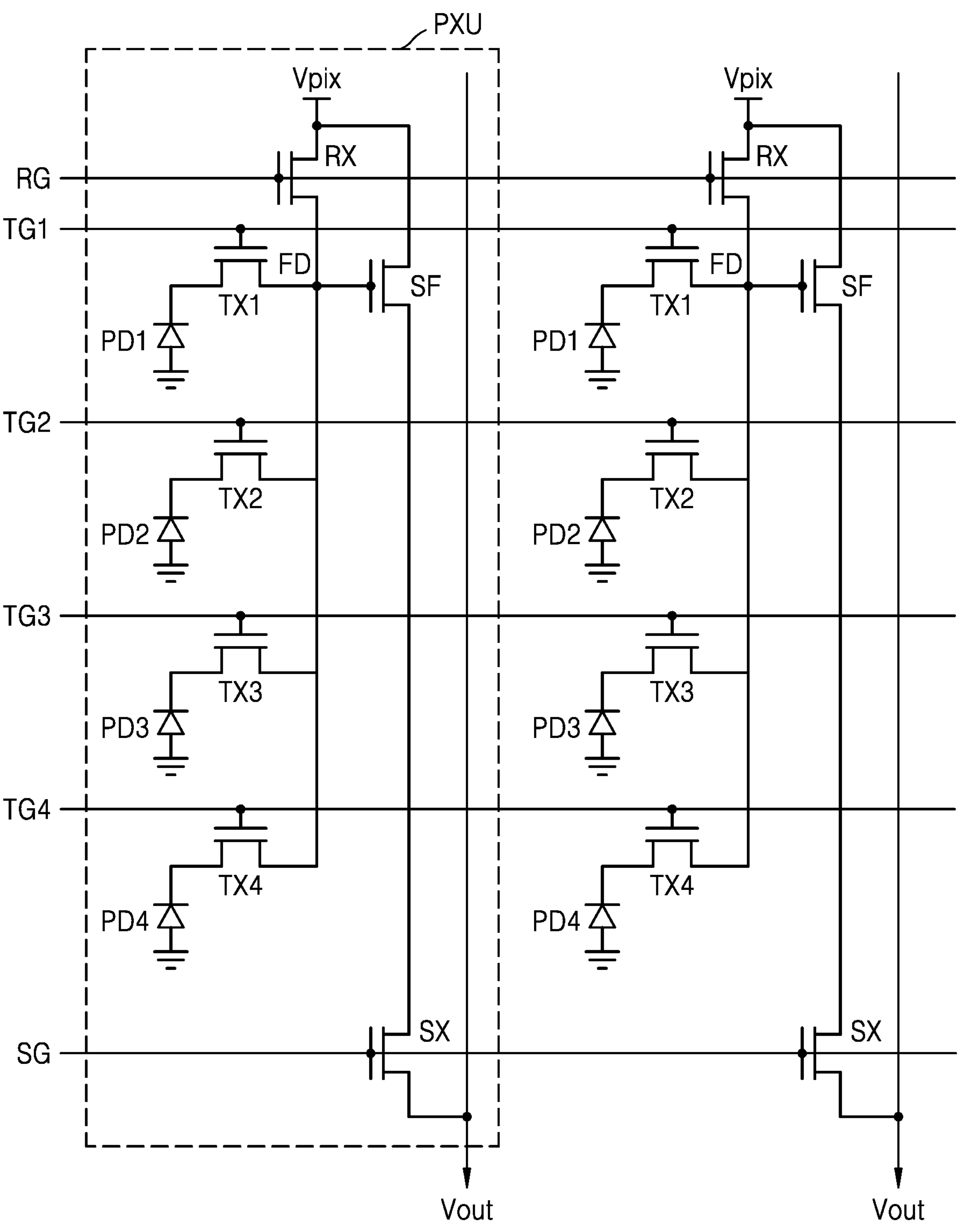
FIG. 3 is another circuit diagram of a unit pixel that may be included in an image sensor according to example embodiments of the disclosure.

FIG. 3 illustrates another example of a circuit diagram of a unit pixel PXU that may be included in the image sensor 100 according to example embodiments of the disclosure.

Referring to FIG. 3, each of the unit pixels PXU included in the pixel array 10 of the image sensor 100 illustrated in FIG. 1 be configured as a 4-shared pixel including four photodiodes, i.e., first to fourth photodiodes PD1, PD2, PD3, and PD4. In one unit pixel PXU, the first to fourth photodiodes PD1, PD2, PD3, and PD4 may have a structure of sharing one floating diffusion region FD through first to fourth transfer transistors TX1, TX2, TX3, and TX4. The first transfer transistor TX1 corresponding to the first photodiode PD1, the second transfer transistor TX2 corresponding to the second photodiode PD2, the third transfer transistor TX3 corresponding to the third photodiode PD3, and the fourth transfer transistor TX4 corresponding to the fourth photodiode PD4 may share one floating diffusion region FD as a common drain region. In one unit pixel PXU, the first to fourth photodiodes PD1, PD2, PD3, and PD4 may share the reset transistor RX, the source follower transistor SF, and the selection transistor SX. Charges may be transmitted from one of the first to fourth photodiodes PD1, PD2, PD3, and PD4 to the floating diffusion region FD according to a signal applied to the first to fourth transfer transistors TX1, TX2, TX3, and TX4 through driving signal lines TG1, TG2, TG3, and TG4.

The image sensor 100 according to example embodiments of the disclosure may detect a reset voltage and a pixel voltage from a unit pixel PXU having the circuit configuration illustrated in FIG. 2 or 3, and may calculate a difference between the reset voltage and the pixel voltage to obtain a pixel signal. The pixel voltage may be a voltage in which charges generated by the photodiodes included in each of the unit pixels PXU illustrated in FIG. 1 are reflected.

Although FIGS. 2 and 3 illustrate a case in which the unit pixel PXU included in the image sensor 100 configures a 2-shared pixel or a 4-shared pixel, the technical spirit of the disclosure is not limited thereto. The unit pixel PXU according to the disclosure may configure an N-shared pixel including N photodiodes (N is an integer greater than or equal to 2). For example, the unit pixels PXU included in the image sensor 100 may each include a 2-shared pixel including two photodiodes, a 4-shared pixel including four photodiodes, or an 8-shared pixel including eight photodiodes.

Figure 4A:
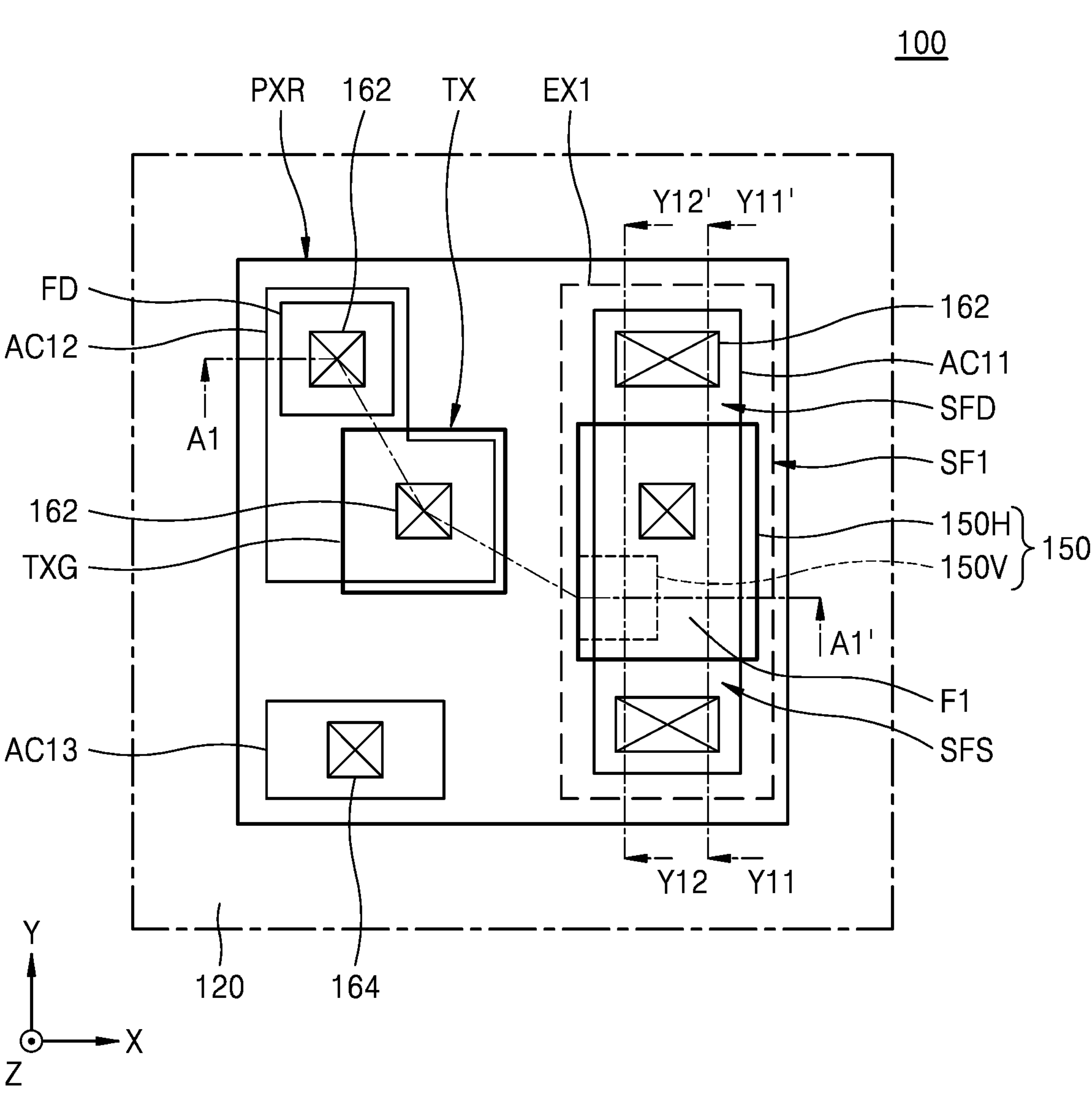
FIG. 4A is a plan layout illustrating, as an example, a structure of a pixel region included in an image sensor according to example embodiments of the disclosure.
Figure 4B:
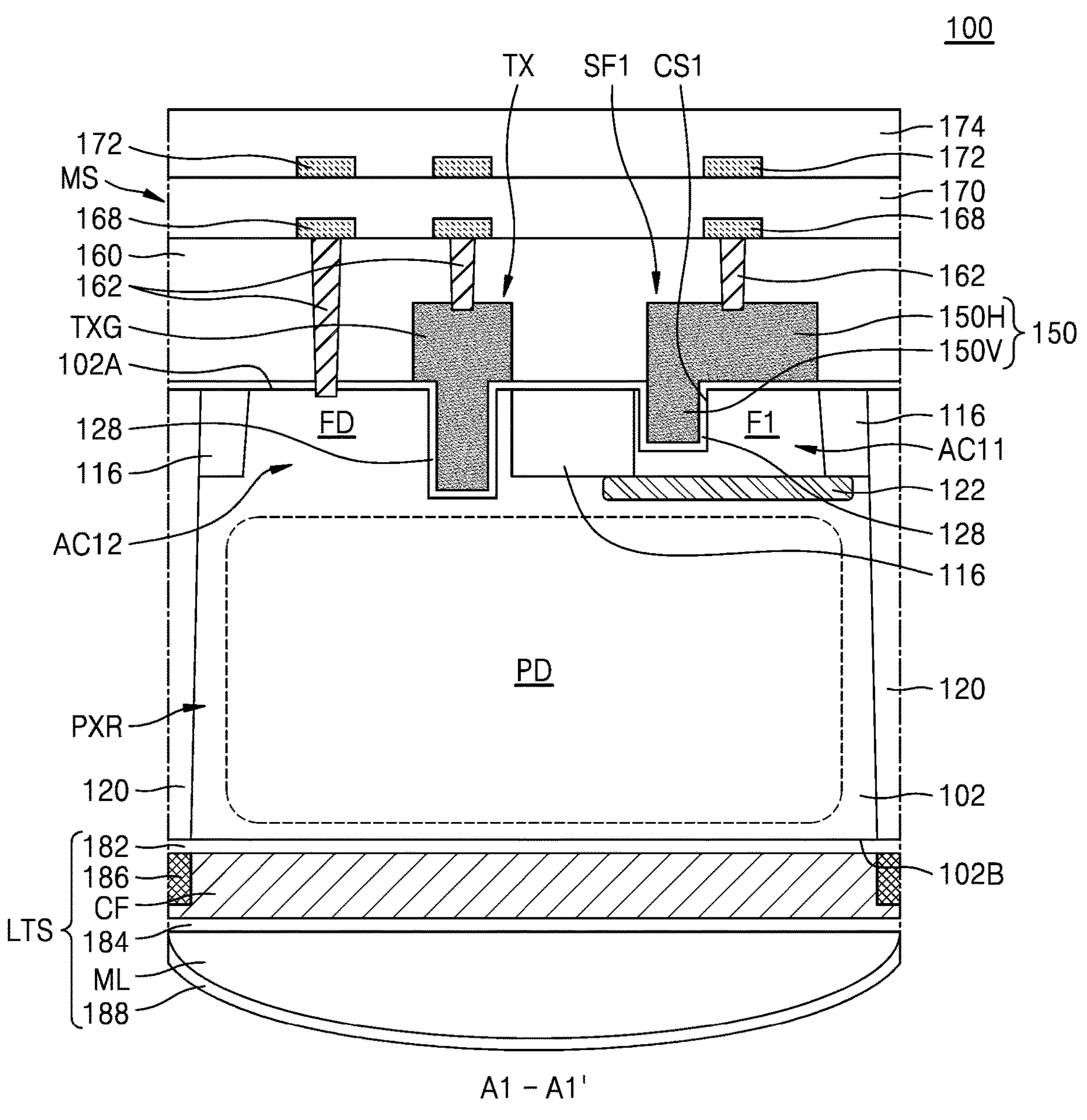
FIG. 4B is a cross-sectional view illustrating, as an example, a configuration, taken along line A1-A1' of FIG. 4A.
Figure 4C:
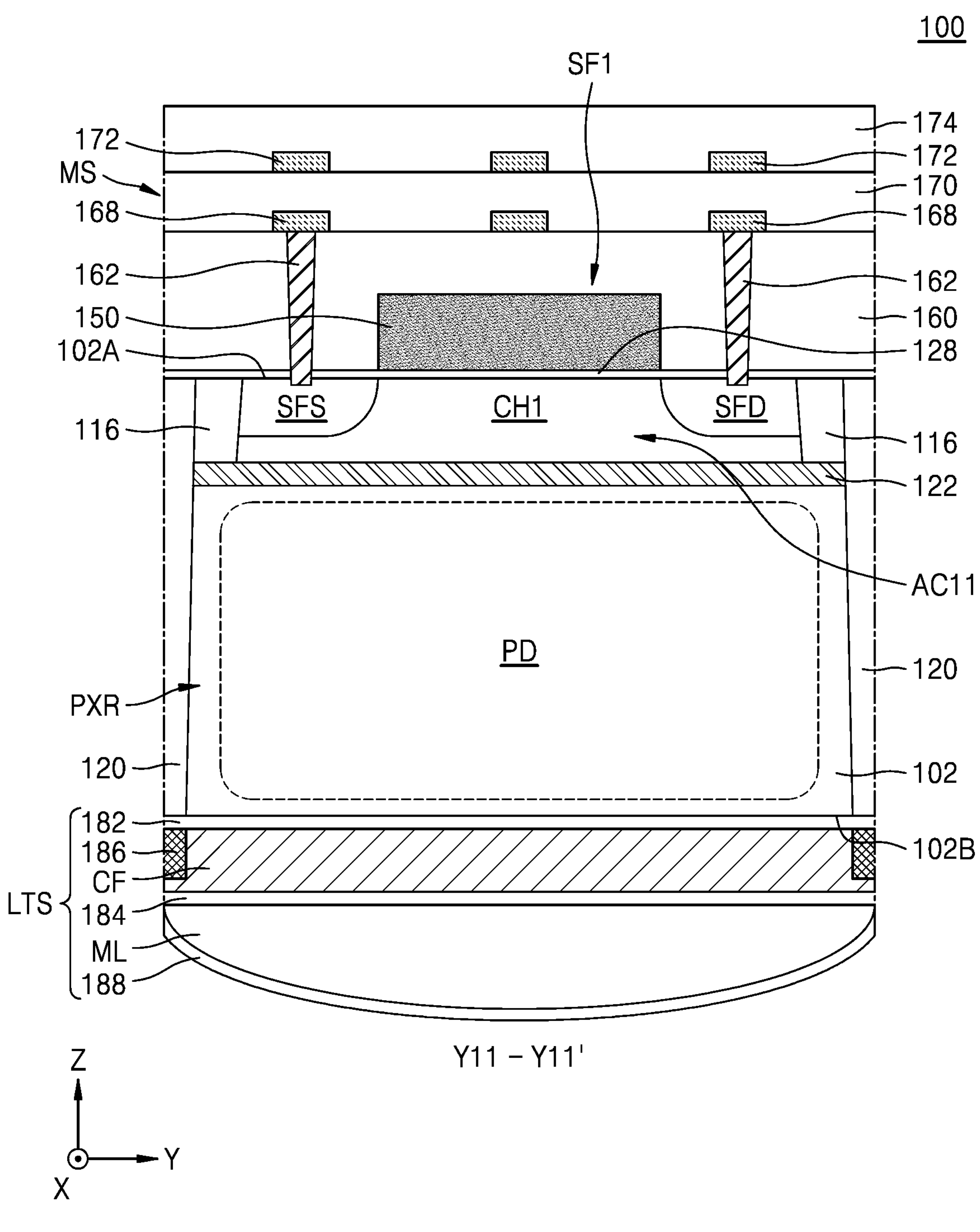
FIG. 4C is a cross-sectional view illustrating, as an example, a configuration, taken along line Y11-Y11' of FIG. 4A.
Figure 4D:
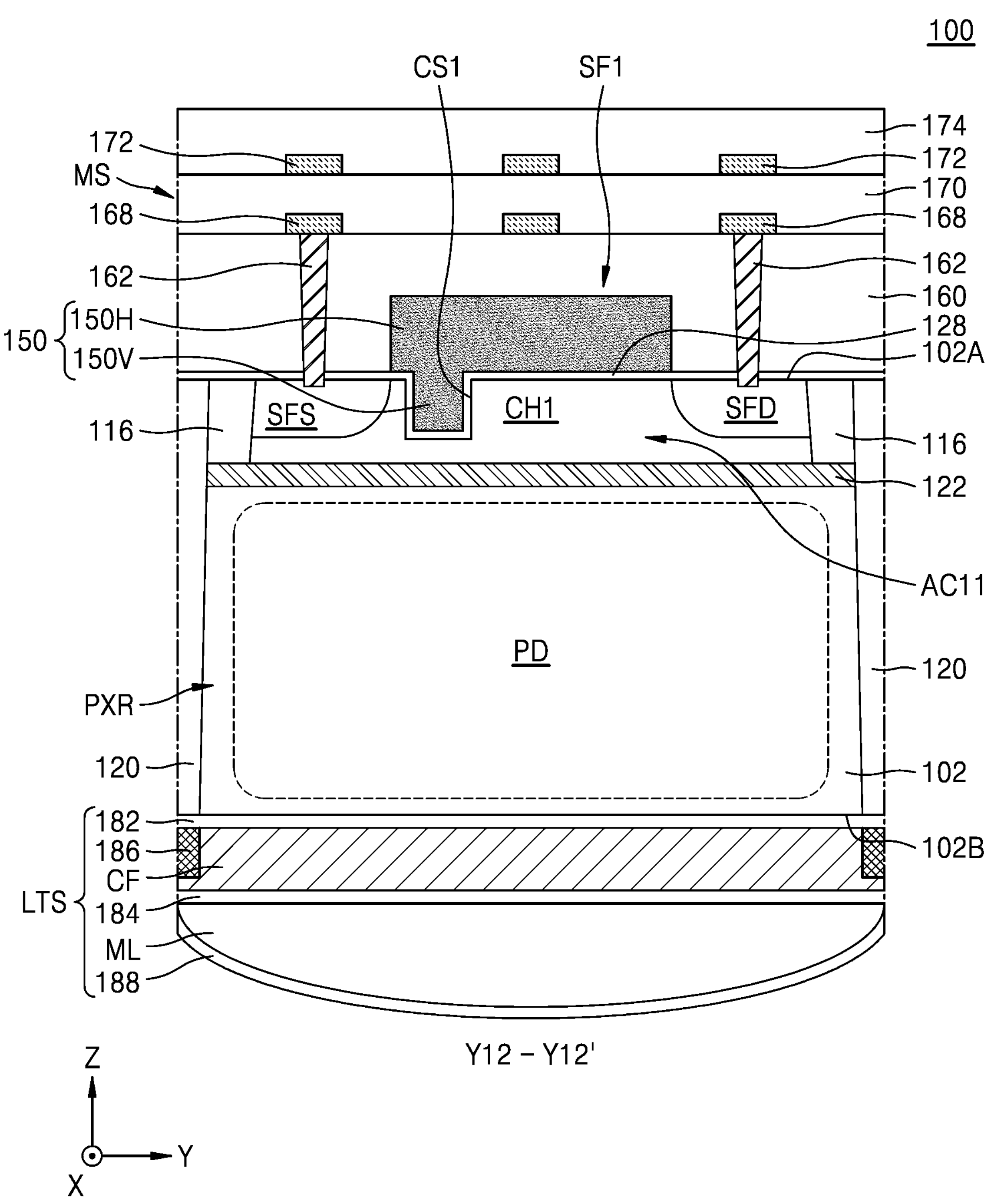
FIG. 4D is a cross-sectional view illustrating, as an example, a configuration, taken along line Y12-Y12' of FIG. 4A.
Figure 4E:
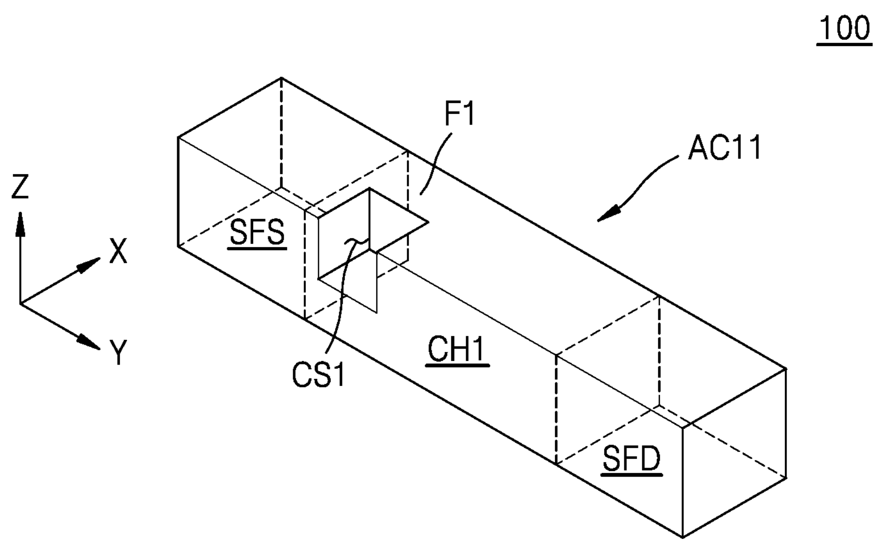
FIG. 4E is a schematic perspective view of a first active region in a region EX1.
Figure 4F:
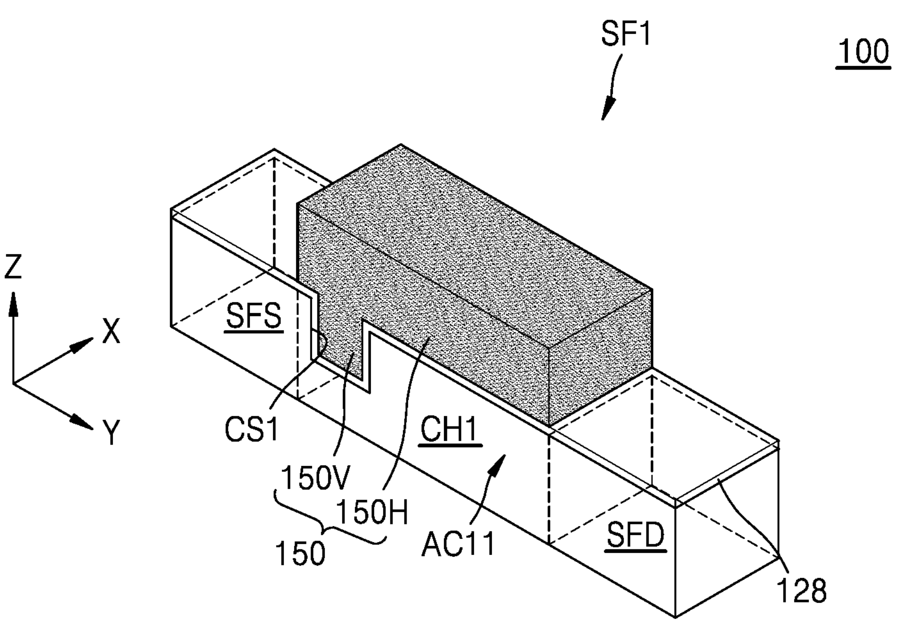
FIG. 4F is a schematic perspective view of a partial region of a source follower transistor in a region EX1 in FIG. 4A.

FIGS. 4A to 4F are views illustrating the image sensor 100 according to example embodiments of the disclosure. FIG. 4A is a planar layout illustrating, as an example, a structure of a pixel region PXR included in the image sensor 100. FIG. 4B is a cross-sectional view showing, as an example, a configuration, taken along line A1-A1' of FIG. 4A. FIG. 4C is a cross-sectional view showing, as an example, a configuration, taken along line Y11-Y11' of FIG. 4A. FIG. 4D is a cross-sectional view showing, as an example, a configuration, taken along line Y12-Y12' of FIG. 4A. FIG. 4E is a schematic perspective view of a first active region AC11 in a region EX1 in FIG. 4A. FIG. 4F is a schematic perspective view of a source follower transistor SF1 in a region EX1 in FIG. 4A.

Referring to FIGS. 4A to 4F, the image sensor 100 may include a substrate 102 having a pixel region PXR. Although one pixel region PXR is illustrated in FIG. 4A, the substrate 102 may include a plurality of pixel regions PXR.

In the substrate 102, the pixel region PXR may be defined by a pixel isolation insulating layer 120. The pixel region PXR may include a photodiode PD formed in the substrate 102. The pixel region PXR may be a region sensing light incident from the outside. According to an example embodiment, the photodiode PD is any one of the first and second photodiodes PD1 and PD2 illustrated in FIG. 2, or any one of the first to fourth photodiodes PD1, PD2, PD3, and PD4 illustrated in FIG. 3.

The substrate 102 may include a semiconductor layer. According to an example embodiment, the substrate 102 may include a semiconductor layer doped with a P-type impurity. For example, the substrate 102 may include a semiconductor layer formed of Si, Ge, SiGe, a group II-VI compound semiconductor, a group III-V compound semiconductor, or a combination thereof, or a silicon on insulator (SOI) substrate. According to an example embodiment, the substrate 102 may include a P-type epitaxial semiconductor layer epitaxially grown from a P-type bulk silicon substrate. The substrate 102 may include a frontside surface 102A and a backside surface 102B opposing each other.

The pixel isolation insulating layer 120 may have a planar structure surrounding the photodiode PD. The pixel isolation insulating layer 120 may extend from the frontside surface 102A of the substrate 102 to the backside surface 102B thereof in the thickness direction of the substrate 102. According to an example embodiment, the pixel isolation insulating layer 120 may include silicon oxide, silicon nitride, SiCN, SiON, SiOC, polysilicon, metal, metal nitride, metal oxide, borosilicate glass (BSG), phosphosilicate glass (PSG), or borophosphosilicate glass (BPSG), plasma enhanced tetraethyl orthosilicate (PE-TEOS), fluoride silicate glass (FSG), carbon doped silicon oxide (CDO), organosilicate glass (OSG), air, or a combination thereof. As used herein, the term "air" may refer to the atmosphere or other gases that may be present during the manufacturing process. For example, the metal that may be included in the pixel isolation insulating layer 120 may be tungsten (W), copper (Cu), or a combination thereof. The metal nitride that may be included in the pixel isolation insulating layer 120 may be TiN, TaN, or a combination thereof. The metal oxide that may be included in the pixel isolation insulating layer 120 may be indium tin oxide (ITO), aluminum oxide ($Al_2O_3$), or a combination thereof.

A plurality of transistors and wiring structures MS may be provided or provided on the frontside surface 102A of the substrate 102. According to an example embodiment, the transistors may include the first and second transfer transistors TX1 and TX2, the reset transistor RX, the source follower transistor SF, and the selection transistor SX described above with reference to FIG. 2. In another example embodiment, the transistors may include the first to fourth transfer transistors TX1, TX2, TX3, and TX4, the reset transistor RX, the source follower transistor SF, and the selection transistor SX described above with reference to FIG. 3. The source follower transistor SF1 and the transfer transistor TX may be provided in the pixel region PXR illustrated in FIG. 4A. The source follower transistor SF1 may correspond to the source follower transistor SF illustrated in FIG. 2 or the source follower transistor SF illustrated in FIG. 3.

A plurality of active regions AC11, AC12, and AC13 may be defined by a device isolation insulating structure 116 in the pixel region PXR illustrated in FIG. 4A. The active regions AC11, AC12, and AC13 may include a first active region AC11, a second active region AC12, and a third active region AC13. According to an example embodiment, the device isolation insulating structure 116 may include an insulating layer including a silicon oxide layer, a silicon nitride layer, or a combination thereof. In another example embodiment, the device isolation insulating structure 116 may be a region doped with a high concentration of P-type impurities.

The first active region AC11 may include a locally asymmetric fin region F1 limited by a locally cutout space CS1. The source follower transistor SF1 may be provided on the first active region AC11. The source follower transistor SF1 may include a gate electrode 150, a source region SFS and a drain region SFD formed in the first active region AC11, a channel region CH1 provided between the source region SFS and the drain region SFD in the first active region AC11, and a gate dielectric layer 128. The gate dielectric layer 128 may be between the first active region AC11 and the gate electrode 150.

As illustrated in FIGS. 4A, 4E, and 4F, when viewed in a plane (an X-Y plane), the first active region AC11 has a rectangular planar shape, which extend in one selected horizontal direction (a Y direction in FIGS. 4A to 4F), the source region SFS may be provided at one end of the first active region AC11 in the selected horizontal direction (the Y direction), and the drain region SFD may be provided at the other end of the first active region AC11 in the selected horizontal direction (the Y direction). That is, a length of the first active region AC11 in the Y direction is longer than a width of the first active region AC11 in the X direction.

The gate electrode 150 may include a horizontal gate portion 150H and a vertical gate portion 150V integrally connected to each other. The horizontal gate portion 150H may have a surface facing the upper surface of the first active region AC11. A portion of the horizontal gate portion 150H may have a surface facing the upper surface of a locally asymmetric fin region F1. The vertical gate portion 150V may fill a locally cutout space CS1 and may have a surface facing one of fin sidewalls of the locally asymmetric fin region F1. As illustrated in FIG. 4B, a vertical level of the bottom surface of the vertical gate portion 150V may be lower than a vertical level of the frontside surface 102A of the substrate 102. According to an example embodiment, the gate electrode 150 may be formed of doped polysilicon. For example, the gate electrode 150 may be formed of polysilicon doped with an N-type impurity, such as phosphorus (P) or arsenic (As).

According to an example embodiment, an insulating capping pattern may be provided on the upper surface of the horizontal gate portion 150H of the gate electrode 150. According to an example embodiment, the upper surface of the horizontal gate portion 150H of the gate electrode 150 may be covered with an insulating capping pattern. According to an example embodiment, an insulating spacer may be provided on sidewalls of the horizontal gate portion 150H of the gate electrode 150. According to an example embodiment, the sidewalls of the horizontal gate portion 150H may be covered with an insulating spacer. Each of the insulating capping pattern and the insulating spacer may include a silicon oxide layer, a silicon nitride layer, a silicon oxynitride layer, or a combination thereof. A contact plug 162 may be connected to the upper surface of the horizontal gate portion 150H of the gate electrode 150.

In the first active region AC11, distances from each of the locally cutout space CS1 and the locally asymmetric fin region F1 to the source region SFS and the drain region SFD may be different from each other along a channel direction (the Y direction in FIGS. 4A and 4C to 4F) formed in the channel region CH1 of the first active region AC11. According to an example embodiment, in the first active region AC11, each of the locally cutout space CS1 and the locally asymmetric fin region F1 may be provided in positions closer to the source region SFS than the drain region SFD. As illustrated in FIGS. 4A, 4D, 4E, and 4F, distances from each of the locally cutout space CS1 and the locally asymmetric fin region F1 to the source region SFS in the channel direction (the Y direction in FIGS. 4A to 4F) formed in the channel region CH1 of the first active region AC11 may be smaller than distances from each of the locally cutout space CS1 and the locally asymmetric fin region F1 to the drain region SFD.

The locally cutout space CS1 may be formed in only one edge portion, among both edge portions of the first active region AC11, in a direction perpendicular to the channel direction in the channel region CH1 (the X direction in FIGS. 4A and 4C to 4F). In the first active regions AC11, the locally asymmetric fin region F1 may be provided in a position shifted from the center of the first active region AC11 to the edge portion of the first active region AC11 in the direction (the X direction) perpendicular to the channel direction in the first active region AC11.

As illustrated in FIG. 4E, the upper surface of the first active region AC11 may have a variable width in the channel direction (the Y direction) formed in the first active region AC11. The width of the uppermost surface of the first active region AC11 may be the smallest in the locally asymmetric fin region F1.

As illustrated in FIG. 4B, the horizontal gate portion 150H of the gate electrode 150 may be provided on the upper surface of the locally asymmetric fin region F1, the vertical gate portion 150V of the gate electrode 150 may be provided on a fin sidewall facing the locally cutout space CS1, among the fin sidewalls of the locally asymmetric fin region F1, and the device isolation insulating structure 116 may be provided on a fin sidewall on the opposite side of the locally cutout space CS1, among the fin sidewalls of the locally asymmetric fin region F1. According to an example embedment, the upper surface of the locally asymmetric fin region F1 may be covered with the horizontal gate portion 150H of the gate electrode 150, a fin sidewall facing the locally cutout space CS1, among the fin sidewalls of the locally asymmetric fin region F1, may be covered with the vertical gate portion 150V of the gate electrode 150, and a fin sidewall on the opposite side of the locally cutout space CS1, among the fin sidewalls of the locally asymmetric fin region F1, may be covered with the device isolation insulating structure 116.

As illustrated in FIG. 4B, the locally cutout space CS1, the locally asymmetric fin region F1, and the gate electrode 150 may each be provided to overlap the photodiode PD in the vertical direction (a Z direction). A barrier region 122 may be provided between the first active region AC11 and the photodiode PD. The barrier region 122 may be a region doped with a high concentration of P-type impurities. The barrier region 122 may serve as a barrier preventing electrons from moving between the photodiode PD and the first active region AC11.

The gate dielectric layer 128 may be provided between the first active region AC11 and the horizontal gate portion 150H of the gate electrode 150 and between the first active region AC11 and the vertical gate portion 150V of the gate electrode 150. The gate dielectric layer 128 may include a portion in contact with the bottom surface of the vertical gate portion 150V. Another portion of the gate dielectric layer 128 may include a portion in contact with the vertical gate portion 150V between the vertical gate portion 150V and the locally asymmetric fin region F1. Each of the gate dielectric layers 128 may include a silicon oxide layer, but is not limited thereto.

The transfer transistor TX may be provided in the second active region AC12, among the active regions AC11, AC12, and AC13. The transfer transistor TX may include a gate electrode TXG. As illustrated in FIG. 4B, a portion of the gate electrode TXG may be buried in the substrate 102. In the transfer transistor TX, a recess channel may be formed in a recess surface of the second active region AC12 surrounding a portion of the gate electrode TXG buried in the substrate 102. The contact plug 162 may be connected to the upper surface of the gate electrode TXG. The transfer transistor TX may configure any one of the first and second transfer transistors TX1 and TX2 described above with reference to FIG. 2, or any one of the first to fourth transfer transistors TX1, TX2, TX3, and TX4 described above with reference to FIG. 3.

As illustrated in FIGS. 4A and 4B, the floating diffusion region FD may be provided on one side of the transfer transistor TX in the second active region AC12. The contact plug 162 may be connected to the floating diffusion region FD.

As illustrated in FIG. 4A, the third active region AC13 may include an impurity region, and a contact plug 164 may be connected to the impurity region of the third active region AC13. The impurity region of the third active region AC13 may be a ground region, and the contact plug 164 connected to the impurity region may be a ground contact plug.

According to an example embodiment, an interlayer insulating layer 160 may be provided on a plurality of transistors including the source follower transistor SF1 and the transfer transistor TX on the frontside surface 102A of the substrate 102. According to an example embodiment, a plurality of transistors including the source follower transistor SF1 and the transfer transistor TX on the frontside surface 102A of the substrate 102 may be covered with an interlayer insulating layer 160. An electrical signal converted by the photodiode PD may be signal-processed by the transistors and a wiring structure MS provided on the frontside surface 102A of the substrate 102. The wiring structure MS may include a plurality of contact plugs 162 selectively connected to the transistors including the source follower transistor SF1 and the transfer transistor TX, a plurality of conductive lines 168 and 172 selectively connected to the transistors through the contact plug 162, and a plurality of interlayer insulating layers 170 and 174 provided on the conductive lines 168 and 172. According to an example embodiment, a plurality of interlayer insulating layers 170 and 174 may be provided on the conductive lines 168 and 172. According to an example embodiment, the gate electrode 150 of the source follower transistor SF1 may be configured to be electrically connectable to the floating diffusion region FD through a plurality of contact plugs 162 and conductive lines 168.

Each of the contact plugs 162 and 164 and the conductive lines 168 and 172 may be formed of a metal, a conductive metal nitride, or a combination thereof. For example, the contact plugs 162 and 164 and the conductive lines 168 and 172 may each be formed of Cu, Al, W, Ti, Mo, Ta, TiN, TaN, ZrN, WN, or a combination thereof but are not limited thereto. Each of the interlayer insulating layers 160, 170, and 174 may include an oxide layer, a nitride layer, or a combination thereof.

The number and arrangement of each of the interlayer insulating layers 160, 170, and 174 and the conductive lines 168 and 172 are not limited to those illustrated in FIGS. 4B to 4D, and may be variously changed and modified as necessary. The conductive lines 168 and 172 included in the wiring structure MS may include wirings connected to a plurality of transistors electrically connected to the photodiode PD formed in the pixel region PXR. The transistors may include the first and second transfer transistors TX1 and TX2, the reset transistor RX, the source follower transistor SF, and the selection transistor SX described above with reference to FIG. 2, or the first to fourth transfer transistors TX1, TX2, TX3, and TX4, the reset transistor RX, the source follower transistor SF, and the selection transistor SX described above with reference to FIG. 3. According to an example embodiment, the reset transistor RX may be provided in a row direction or a column direction near the pixel regions PXR. The electrical signal converted by the photodiode PD may be processed in the wiring structure MS. The conductive lines 168 and 172 may be freely provided regardless of the arrangement of the photodiode PD.

As illustrated in FIGS. 4B to 4D, a light transmitting structure LTS may be provided on the backside surface 102B of the substrate 102. The light transmitting structure LTS may include a first planarization layer 182, a color filter CF, a second planarization layer 184, a microlens ML, and a protective capping layer 188 sequentially stacked on the backside surface 102B of the substrate 102. The microlens ML may be protected by the protective capping layer 188. The light transmitting structure LTS may collect and filter light incident from the outside and provide collected and filtered light to the pixel region PXR. The microlens ML may have an outwardly convex shape to collect light incident on the photodiode PD. The pixel region PXR may have a backside illumination (BSI) structure receiving light from the backside surface 102B side of the substrate 102.

In the light transmitting structure LTS, the first planarization layer 182 may be used as a buffer layer for preventing the substrate 102 from being damaged during the manufacturing process of the image sensor 100. Each of the first planarization layer 182 and the second planarization layer 184 may include a silicon oxide layer, a silicon nitride layer, a resin, or a combination thereof, but is not limited thereto.

According to an example embodiment, the color filter CF may include a red color filter, a green color filter, a blue color filter, or a white color filter. The white color filter may be a transparent color filter that transmits light in a visible light wavelength band. In the pixel array 10 illustrated in FIG. 1, a red color filter, a green color filter, a blue color filter, and a white color filter may be arranged in a 2×2 2D array to form one color filter group, and the pixel array 10 may include a plurality of color filter groups. The color filter groups may be arranged in a matrix form in a plurality of row lines and a plurality of column lines. In another example embodiment, the color filter CF may have another color, such as cyan, magenta, or yellow.

The light transmitting structure LTS may further include an anti-reflection layer 186 formed on the first planarization layer 182. The anti-reflection layer 186 may be provided in a position overlapping the pixel isolation insulating layer 120 defining the pixel region PXR in a vertical direction (the Z direction) on an edge portion of the pixel region PXR. The upper surface and sidewalls of the anti-reflection layer 186 may be covered with a color filter CF. The anti-reflection layer 186 may prevent incident light passing through the color filter CF from being laterally reflected or scattered. For example, the anti-reflection layer 186 may prevent photons reflected or scattered at the interface between the color filter CF and the first planarization layer 182 from moving to another sensing region. The anti-reflection layer 186 may include a metal. For example, the anti-reflection layer 186 may include W, Al, Cu, or a combination thereof.

Although FIGS. 4A to 4F illustrate a configuration of a portion of the pixel region PXR included in the unit pixels PXU illustrated in FIG. 1, the substrate 102 of the image sensor 100 may further include a region in which the unit pixels PXU described above with reference to FIG. 1 are provided, a peripheral circuit region provided near the unit pixels PXU, and a pad region. The peripheral circuit region may include various types of circuits for controlling the unit pixels PXU (refer to FIG. 1). For example, the peripheral circuit region may include a plurality of transistors. The transistors provided in the peripheral circuit region may be driven to provide a constant signal to the photodiode PD formed in the pixel region PXR or to control an output signal from the photodiode PD. For example, the transistors provided in the peripheral circuit region may include various types of logic circuits, such as a timing generator, a row decoder, a row driver, a CDS, an ADC, a latch, and a column decoder. The pad region may include a conductive pad electrically connected to circuits in the peripheral circuit region and the unit pixels PXU. The conductive pad may function as a connection terminal that provides power and a signal to the unit pixels PXU (refer to FIG. 1) and the circuits in the peripheral circuit region from the outside.

In order to secure a linear gain in the source follower transistor SF1 of the image sensor 100, an operation in a saturation mode having a constant source output voltage Vs according to a gate input voltage Vg regardless of a drain voltage Vds is required. If the first active region AC11 includes a fin-type active region having a constant width in the channel direction from the source region SFS to the drain region SFD, inversion may occur up to a drain stage and the operation of the source follower transistor SF1 may enter a linear mode. In the linear mode operation of the source follower transistor SF1, the source output voltage Vs with respect to the gate input voltage Vg may vary according to the drain voltage Vds, and as a result, it may be difficult to secure a linear gain in the source follower transistor SF1.

In the image sensor 100 according to example embodiments of the disclosure described above with reference to FIGS. 4A to 4F, the locally asymmetric fin region F1 formed locally in the first active region AC11 may be provided in a position closer to the source region SFS than the drain region SFD. Accordingly, it may be easy to secure a linear gain in the source follower transistor SF1. In addition, during the saturation mode operation, due to the locally asymmetric fin region F1 provided to be closer to the source region SFS, an effective width of the channel region CH1 at a source stage of the source follower transistor SF1 may increase, so that resistance at the source stage may be lower than resistance at the drain stage. Accordingly, a structure advantageous for the saturation mode operation may be provided in the source follower transistor SF1. As such, the image sensor 100 according to example embodiments of the disclosure has a local FinFET structure in which a partial region of the gate electrode 150 in the source follower transistor SF1 covers only the upper surface of the locally asymmetric fin region F1 and one fin sidewall. Accordingly, even if the image sensor 100 is highly integrated and the size of the pixel region PXR is miniaturized, noise characteristics of the pixel may be improved and electrical characteristics of the source follower transistor SF1 may be secured, without making the manufacturing process of the image sensor 100 difficult or incurring high manufacturing costs.

Figure 5A:
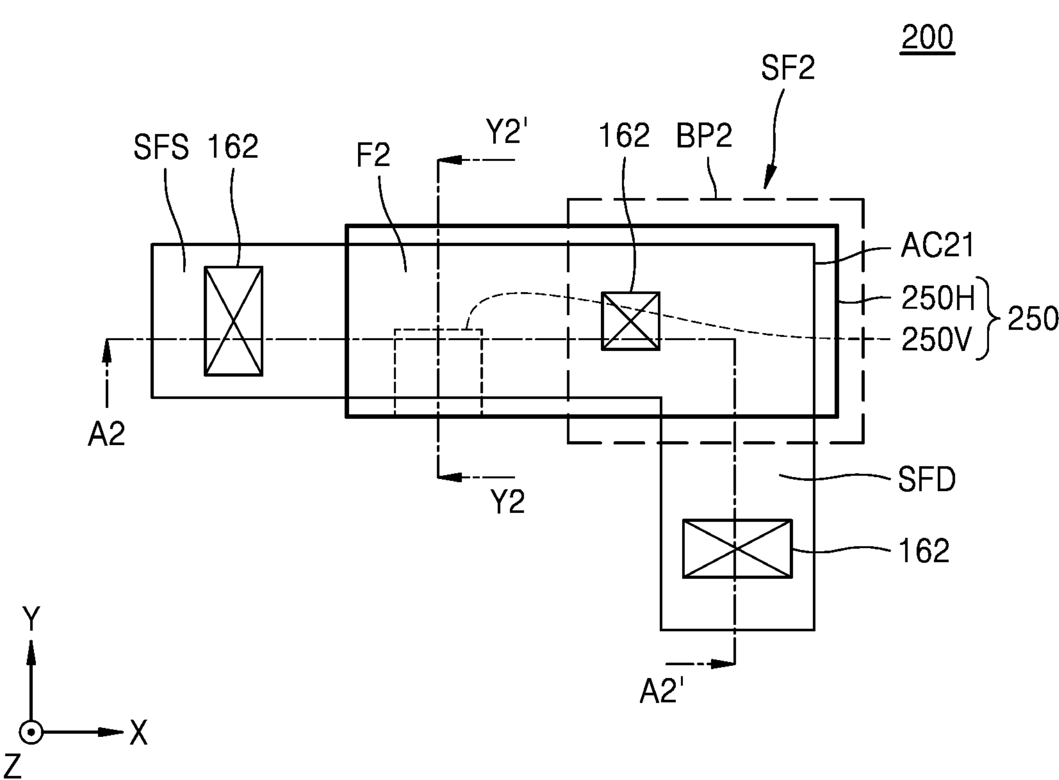
FIG. 5A is a plan layout illustrating, as an example, a structure of a portion of a pixel region included in an image sensor according to another example embodiment of the disclosure.
Figure 5B:
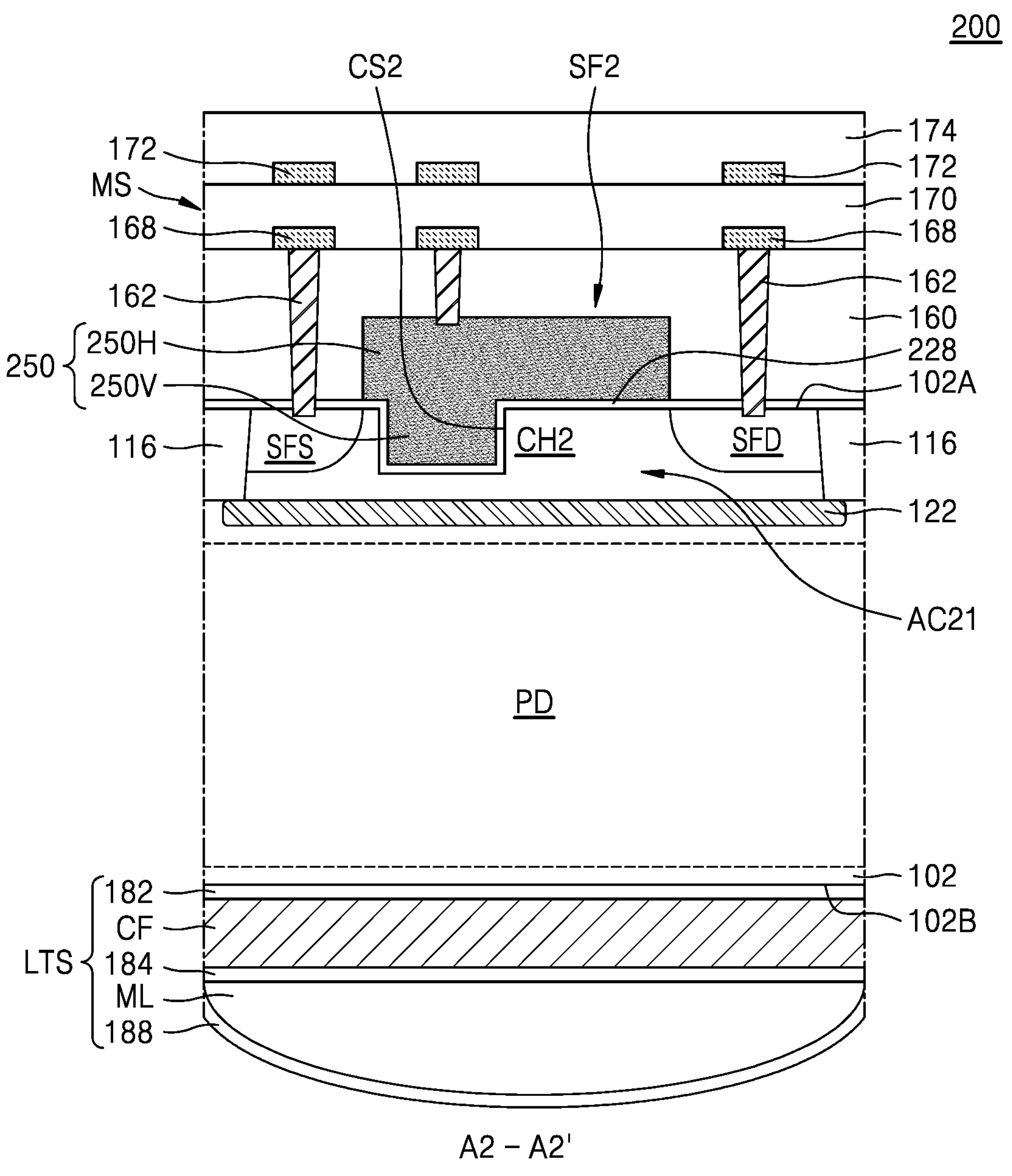
FIG. 5B is a cross-sectional view illustrating, as an example, a configuration, taken along line A2-A2' of FIG. 5A.
Figure 5C:
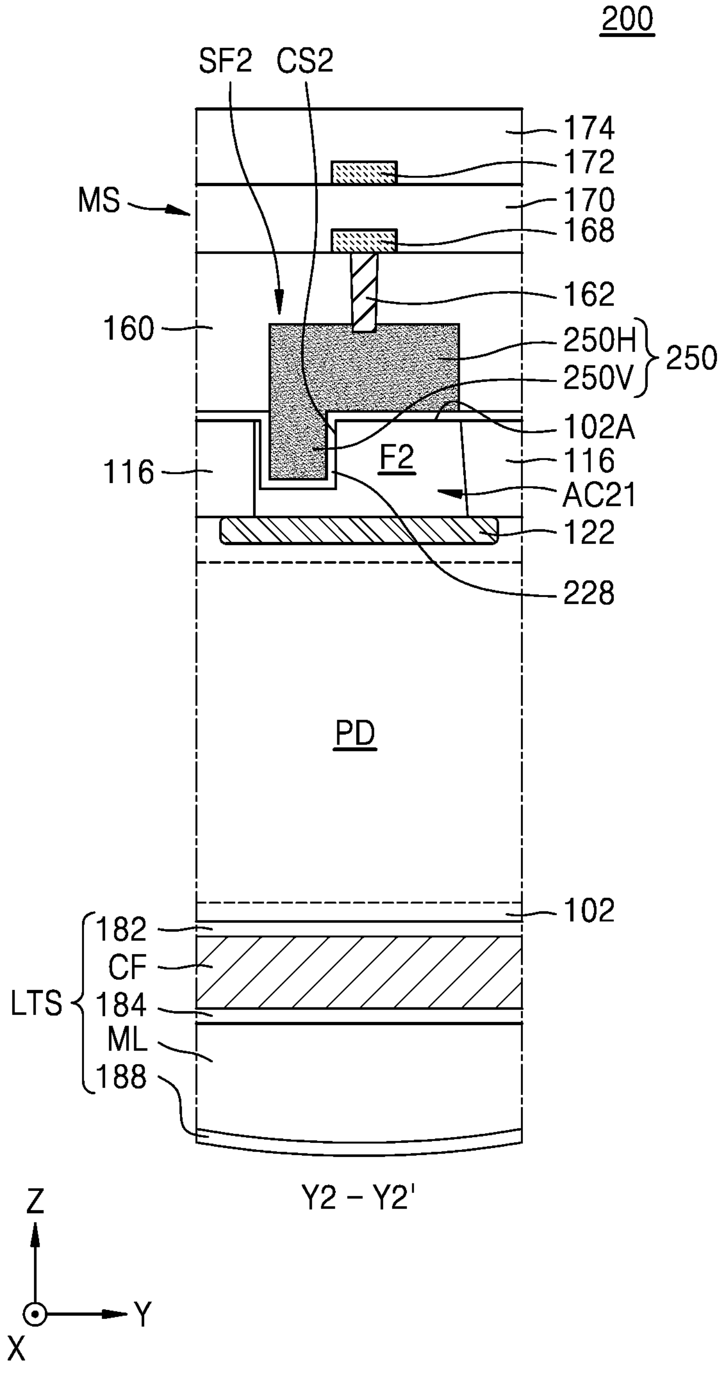
FIG. 5C is a cross-sectional view illustrating, as an example, a configuration taken along line Y2-Y2' of FIG. 5A.
Figure 5D:
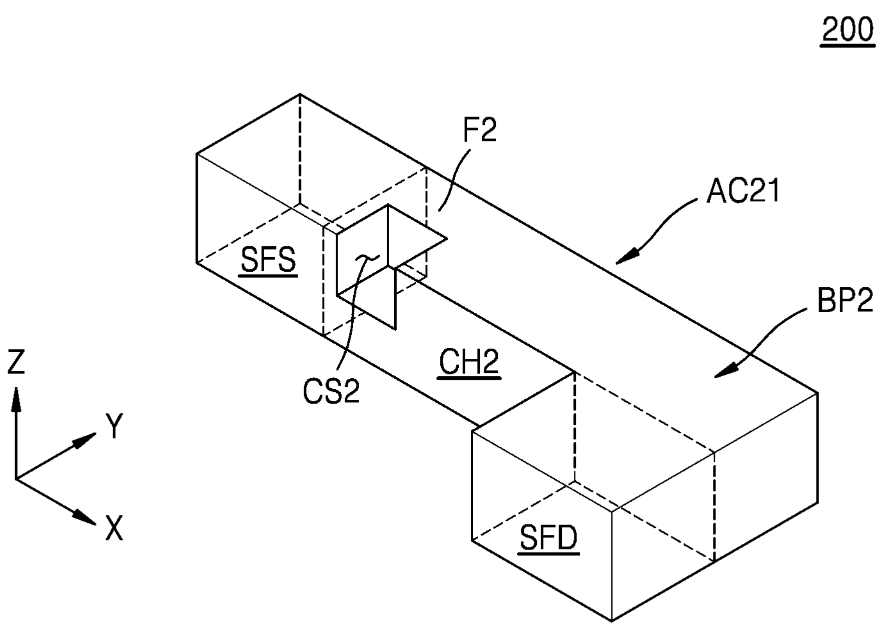
FIG. 5D is a schematic perspective view of a first active region illustrated in FIG. 5A.
Figure 5E:
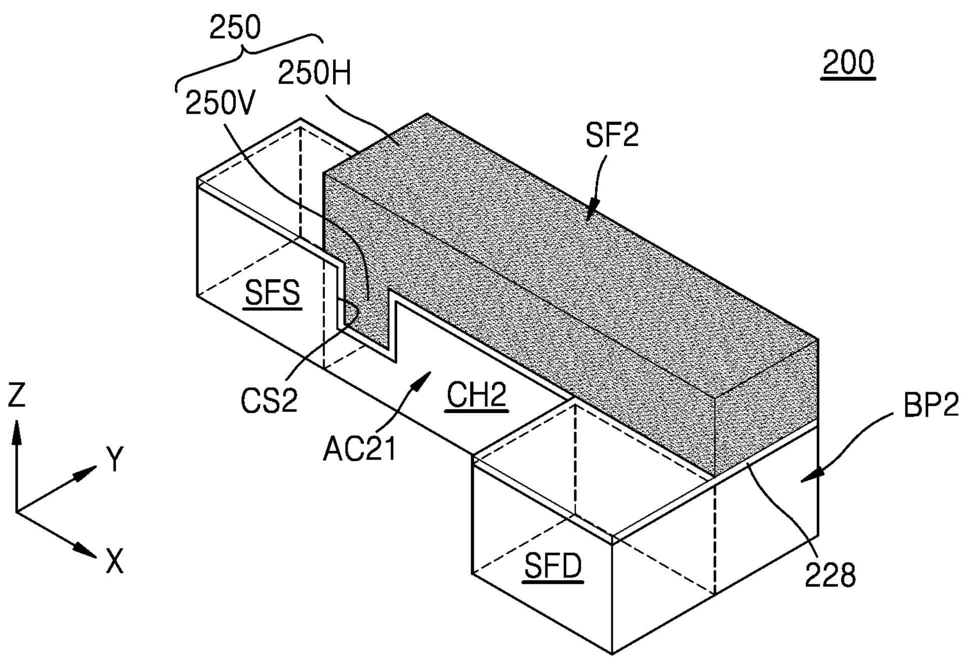
FIG. 5E is a schematic perspective view of a partial region of a source follower transistor illustrated in FIG. 5A.

FIGS. 5A to 5E are diagrams illustrating an image sensor 200 according to example embodiments of the disclosure. FIG. 5A is a planar layout illustrating, as an example, a structure of a partial region of a pixel region included in the image sensor 200. FIG. 5A illustrates a planar layout of a region corresponding to a partial region of the pixel region PXR illustrated in FIG. 4A. FIG. 5B is a cross-sectional view showing, as an example, a configuration, taken along line A2-A2' of FIG. 5A. FIG. 5C is a cross-sectional view showing, as an example, a configuration, taken along line Y2-Y2' of FIG. 5A. FIG. 5D is a schematic perspective view of a first active region A21 illustrated in FIG. 5A. FIG. 5E is a schematic perspective view of a source follower transistor SF2 illustrated in FIG. 5A. In FIGS. 5A to 5E, the same reference numerals as those in FIGS. 4A to 4F denote the same members, and detailed descriptions thereof are omitted here.

Referring to FIGS. 5A to 5E, the image sensor 200 has substantially the same configuration as that of the image sensor 100 described above with reference to FIGS. 4A to 4F. However, the image sensor 200 may include a first active region AC21 having a locally asymmetric fin region F2 limited by a locally cutout space CS2. The source follower transistor SF2 may be provided on the first active region AC21.

The source follower transistor SF2 may include a gate electrode 250, a source region SFS and a drain region SFD formed in the first active region AC21, a channel region CH2 provided between the source region SFS and the drain region SFD in the first active region AC21, and a gate dielectric layer 228. The gate dielectric layer 228 may be between the first active region AC21 and the gate electrode 250.

As illustrated in FIGS. 5A, 5D, and 5E, when viewed in a plane (the X-Y plane), the first active region AC21 may have an L-shaped planar shape including a bent portion BP2. The source follower transistor SF2 may be configured to form a channel in a bending direction according to the planar shape of the first active region AC21. The source region SFS may be provided at one end of the first active region AC21, and the drain region SFD may be provided at the other end of the first active region AC21.

The gate electrode 250 may include a horizontal gate portion 250H and a vertical gate portion 250V that are integrally connected to each other. The horizontal gate portion 250H may have a surface facing the upper surface of the first active region AC21. A portion of the horizontal gate portion 250H may cover the upper surface of the locally asymmetric fin region F2. The vertical gate portion 250V may fill the locally cutout space CS2. The horizontal gate portion 250H may cover the bent portion BP2 of the first active region AC21. The vertical gate portion 250V may be horizontally apart from the bent portion BP2 of the first active region AC21.

As illustrated in FIG. 5C, a vertical level of the bottom surface of the vertical gate portion 250V may be lower than a vertical level of the frontside surface 102A of the substrate 102. The vertical gate portion 250V may have a surface facing the fin sidewall of the locally asymmetric fin region F2 of the first active region AC21.

In the first active region AC21, distances from each of the locally cutout space CS2 and the locally asymmetric fin region F2 to the source region SFS and the drain region SFD in the channel direction in the channel region CH2 of the first active region AC21 may be different from each other. According to an example embodiment, in the first active region AC21, the locally cutout space CS2 and the locally asymmetric fin region F2 may each be provided in positions closer to the source region SFS than the drain region SFD. As illustrated in FIGS. 5A, 5D, and 5E, distances from each of the locally cutout space CS2 and the locally asymmetric fin region F2 to the source region SFS in the channel direction in the channel region CH2 of the first active region AC21 may be smaller than the distances from each of the locally cutout space CS2 and the locally asymmetric fin region F2 to the drain region SFD in the channel direction in the channel region CH2. In the first active region AC21, the locally cutout space CS2 may be formed in only one edge portion, among both edge portions of the first active region AC21, in a direction perpendicular to the channel direction in the channel region CH2. In the first active region AC21, the locally asymmetric fin region F2 may be provided in a position shifted from the center of the first active region AC21 to the edge portion side of the first active region AC21 in a direction perpendicular to the channel direction in the first active region AC21.

When viewed from the frontside surface 102A of the substrate 102, the first active region AC21 may include an inner edge portion connected to an inner side of the bent portion BP2 and an outer edge portion connected to an outer side of the bent portion BP2, and the locally cutout space CS2 may be formed in the inner edge portion of the first active region AC21. One of the fin sidewalls of the locally asymmetric fin region F2 may configure the outer edge portion of the first active region AC21.

As illustrated in FIG. 5D, the uppermost surface of the first active region AC21 has a variable width in the channel direction in the first active region AC21, and the width of the uppermost surface of the first active region AC21 may be the smallest in the locally asymmetric fin region F2.

As illustrated in FIG. 5C, the upper surface of the fin of the locally asymmetric fin region F2 may be covered with the horizontal gate portion 250H of the gate electrode 250, one side fin sidewall of the locally asymmetric fin region F2 facing the locally cutout space CS2 may be covered with the vertical gate portion 250V of the gate electrode 250, and the other side fin sidewall of the locally asymmetric fin region F2 on the opposite side of the locally cutout space CS2 may be covered with the device isolation insulating structure 116.

As illustrated in FIG. 5C, the locally cutout space CS2, the locally asymmetric fin region F2, and the gate electrode 250 may each be provided to overlap the photodiode PD in the vertical direction (a Z direction). A barrier region 122 may be provided between the first active region AC21 and the photodiode PD.

A detailed configuration of the first active region AC21, the locally asymmetric fin region F2, the gate electrode 250, and the gate dielectric layer 228 of the source follower transistor SF2 is substantially the same as that of the first active region AC11, the locally asymmetric fin region F1, the gate electrode 150, and the gate dielectric layer 128 of the source follower transistor SF1 described above with reference to FIGS. 4A to 4F.

In the image sensor 200 according to example embodiments of the disclosure described with reference to FIGS. 5A to 5E, the first active region AC21 may include the locally asymmetric fin region F2 having an L-shaped planar shape including the bent portion BP2 and limited by the locally cutout space CS2. The locally cutout space CS2 and the locally asymmetric fin region F2 may each be provided in positions closer to the source region SFS than the drain region SFD. In the source follower transistor SF2, the locally cutout space CS2 may be formed in a position adjacent to the source region SFS inside the bent portion BP2, which is a portion where current is concentrated in the first active region AC21. Accordingly, the source follower transistor SF2 may have a local FinFET structure in which a partial region of the gate electrode 250 covers only the fin upper surface and one fin sidewall of the locally asymmetric fin region F2. Accordingly, even if the image sensor 200 is highly integrated and the size of the pixel region PXR is miniaturized, noise characteristics of the pixel may be improved and electrical characteristics of the source follower transistor SF2 may be secured, without making the manufacturing process of the image sensor 200 difficult or incurring high manufacturing costs.

Figure 6A:
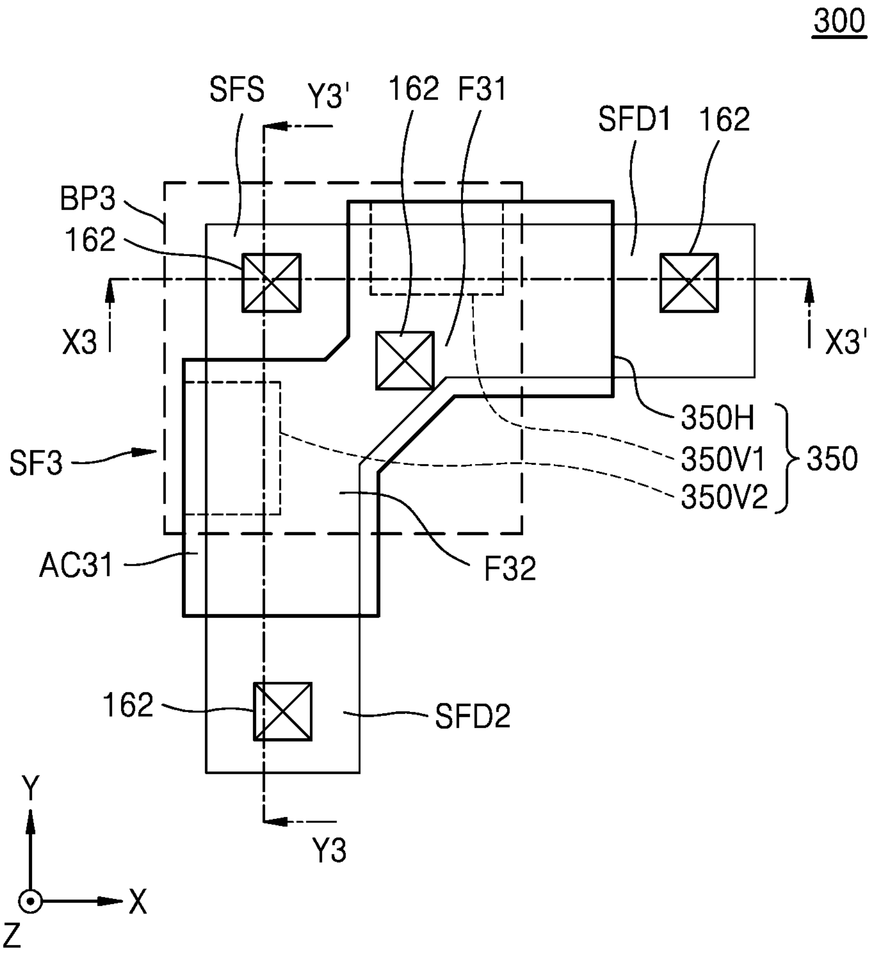
FIG. 6A is a plan layout illustrating, as an example, a structure of a portion of a pixel region included in an image sensor according to another example embodiment of the disclosure.
Figure 6B:
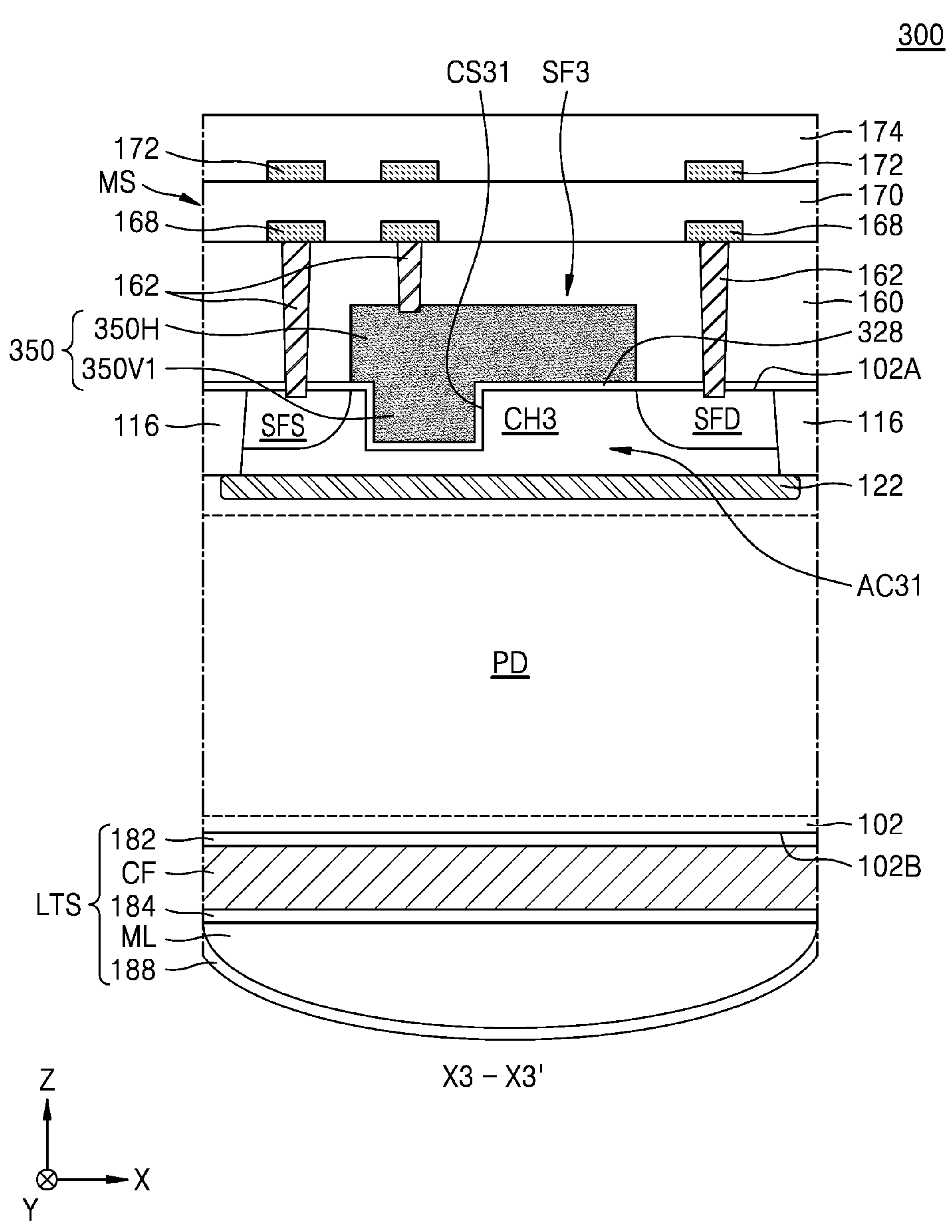
FIG. 6B is a cross-sectional view illustrating, as an example, a configuration, taken along line X3-X3'.
Figure 6C:
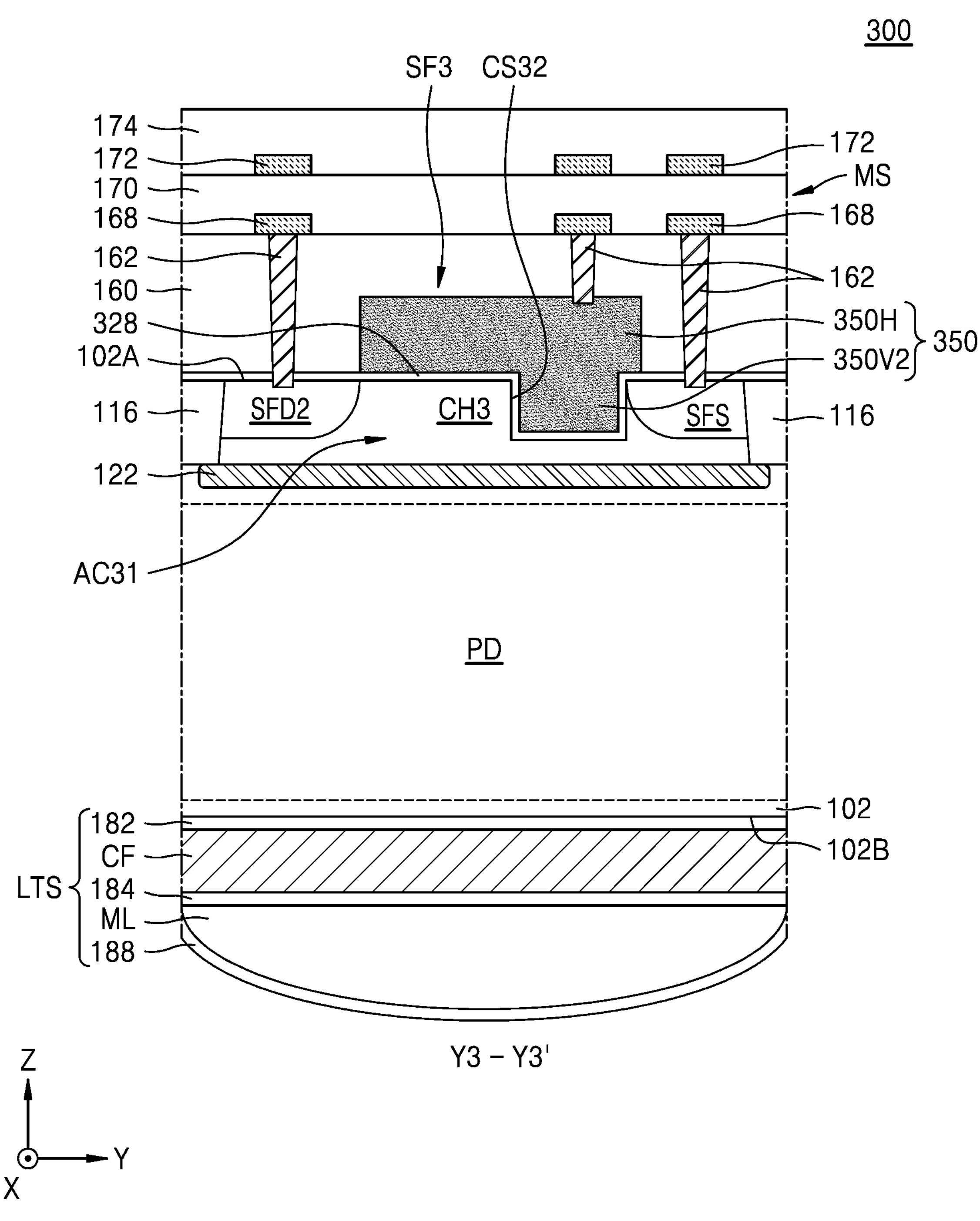
FIG. 6C is a cross-sectional view illustrating, as an example, a configuration, taken along line Y3-Y3' of FIG. 6A.
Figure 6D:
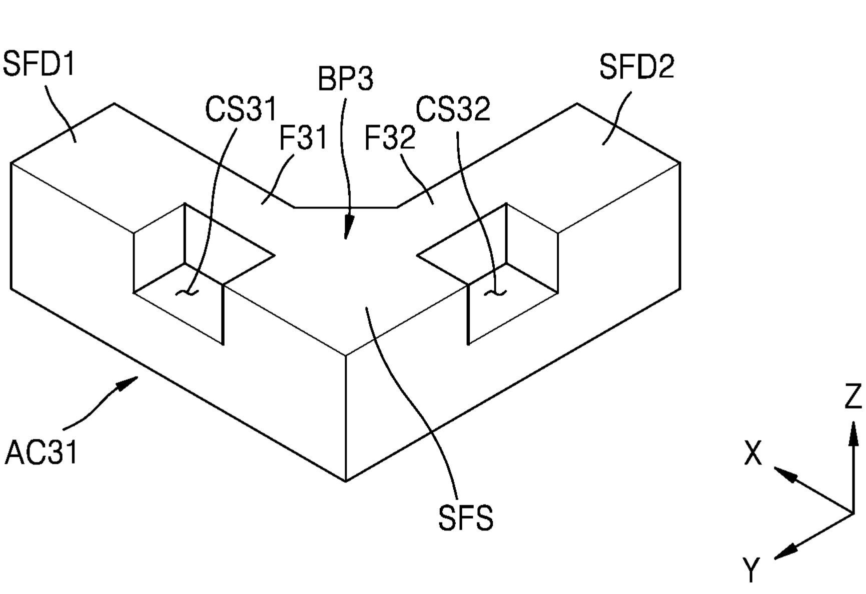
FIG. 6D is a schematic perspective view of a first active region illustrated in FIG. 6A.
Figure 6E:
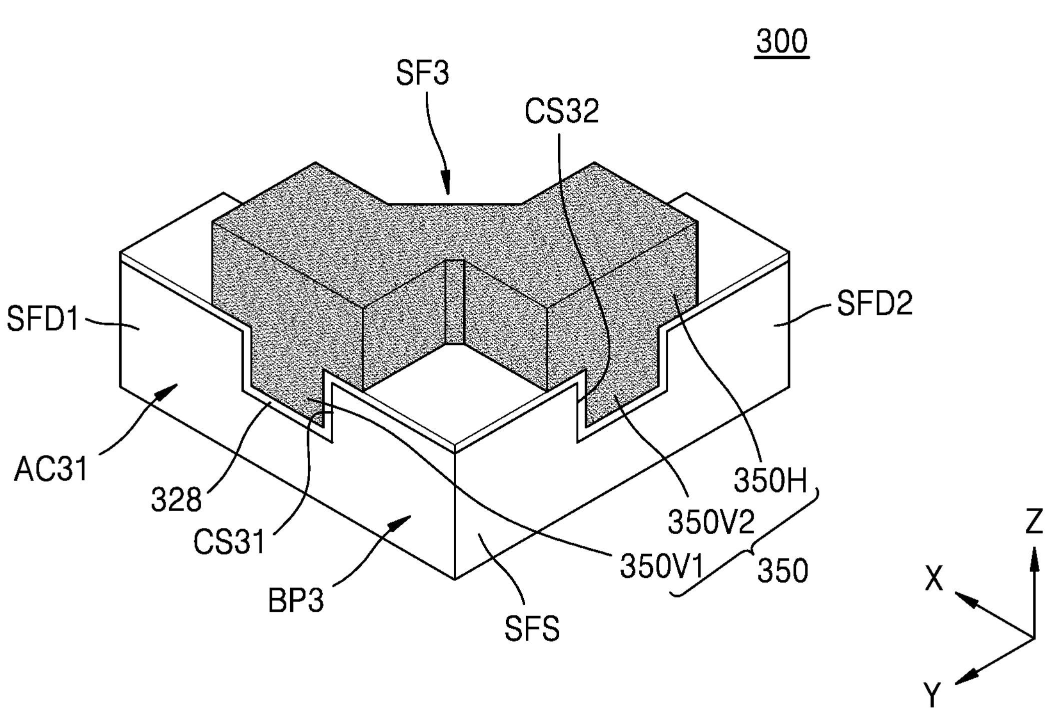
FIG. 6E is a schematic perspective view of a partial region of a source follower transistor illustrated in FIG. 6A.

FIGS. 6A to 6E are diagrams illustrating an image sensor 300 according to another example embodiment of the disclosure. FIG. 6A is a planar layout illustrating, as an example, a structure of a partial region of a pixel region included in the image sensor 300. FIG. 6A illustrates a planar layout of a region corresponding to a partial region of the pixel region PXR illustrated in FIG. 4A. FIG. 6B is a cross-sectional view showing, as an example, a configuration, taken along line X3-X3' of FIG. 6A. FIG. 6C is a cross-sectional view showing, as an example, a configuration, taken along line Y3-Y3' of FIG. 6A. FIG. 6D is a schematic perspective view of a first active region A31 illustrated in FIG. 6A. FIG. 6E is a schematic perspective view of a source follower transistor SF3 illustrated in FIG. 6A. In FIGS. 6A to 6E, the same reference numerals as those in FIGS. 4A to 4F denote the same members, and detailed descriptions thereof are omitted herein.

Referring to FIGS. 6A to 6E, the image sensor 300 has substantially the same configuration as that of the image sensor 100 described above with reference to FIGS. 4A to 4F. However, the image sensor 300 may include a source follower transistor SF3 formed as a dual transistor in which two local transistors sharing one source region SFS are connected in parallel.

The image sensor 300 may include a first active region AC31 having a pair of locally asymmetric fin regions F31 and F32 limited by a pair of locally cutout spaces CS31 and CS32. As illustrated in FIGS. 6A, 6D, and 6E, when viewed in a plane (the X-Y plane), the first active region AC31 may approximately have an L-shaped planar shape including a bent portion BP3. The source follower transistor SF3 including a dual transistor may be provided on the first active region AC31.

The source region SFS may be provided in the bent portion BP3 of the first active region AC31. The source follower transistor SF3 may include a first drain region SFD1 provided at one end of the first active region AC31 and a second drain region SFD2 provided at the other end of the first active region AC31. In the first active region AC31, the pair of locally cutout spaces CS31 and CS32 may include a first locally cutout space CS31 provided in a position closer to the source region SFS between the source region SFS and the first drain region SFD1 and a second locally cutout space CS32 provided in a position closer to the source region SFS between the source region SFS and the second drain region SFD2. The pair of locally asymmetric fin regions F31 and F32 may include a first locally asymmetric fin region F31 provided in a position closer to the source region SFS between the source region SFS and the first drain region SFD1 and a second locally asymmetric fin region F32 provided in a position closer to the source region SFS between the source region SFS and the second drain region SFD2.

In the first active region AC31, the first locally asymmetric fin region F31 and the second locally asymmetric fin region F32 may be formed in only one edge portion, among both edge portions of the first active region A31, in a direction perpendicular to a channel direction in a channel region CH3. The first locally asymmetric fin region F31 and the second locally asymmetric fin region F32 of the first active region AC31 may be provided in a position shifted from the center of the first active region AC31 to the edge portion of the first active region AC31 in a direction perpendicular to a channel direction in the first active region AC31.

When viewed from the frontside surface 102A of the substrate 102, the first active region AC31 may include an inner edge portion connected to an inner side of the bent portion BP3 and an outer edge portion connected to an outer side of the bent portion BP3. The first locally cutout space CS31 and the second locally cutout space CS32 may be provided in positions closer to the outer edge portion, among the inner edge portion and the outer edge portion of the first active region AC31. The first locally asymmetric fin region F31 and the second locally asymmetric fin region F32 may be provided in positions closer to the inner edge portion, among the inner edge portion and the outer edge portion of the first active region AC31.

As illustrated in FIG. 6D, the uppermost surface of the first active region AC31 may have a variable width in the channel direction in the first active region AC31. The width of the uppermost surface of the first active region AC31 between the source region SFS and the first drain region SFD1 may be the smallest in the first locally asymmetric fin region F31. The width of the uppermost surface of the first active region AC31 between the source region SFS and the second drain region SFD2 may be the smallest in the second locally asymmetric fin region F32.

The source follower transistor SF3 may include a gate electrode 350, the source region SFS formed in the first active region AC31, the first drain region SFD1, the second drain region SFD2, the channel region CH3 between the source region SFS and the first drain region SFD1 and between the source region SFS and the second drain region SFD2 in the first active region AC31, and a gate dielectric layer 328. The gate dielectric layer 328 may be between the first active region AC31 and the gate electrode 350.

The gate electrode 350 may include a horizontal gate portion 350H, a first vertical gate portion 350V1, and a second vertical gate portion 350V2 integrally connected to each other. The horizontal gate portion 350H, the first vertical gate portion 350V1, and the second vertical gate portion 350V2 may be integrally connected to each other. The horizontal gate portion 350H may have a surface facing the upper surface of the first active region AC31. The horizontal gate portion 350H may cover a portion of the bent portion BP3 of the first active region AC31. An upper surface of each of the first locally asymmetric fin region F31 and the second locally asymmetric fin region F32 may be covered with the horizontal gate portion 350H. The first vertical gate portion 350V1 may fill the first locally cutout space CS31, and the second vertical gate portion 350V2 of the gate electrode 350 may fill the second locally cutout space CS32.

As illustrated in FIGS. 6B and 6C, a vertical level of a bottom surface of each of the first vertical gate portion 350V1 and the second vertical gate portion 350V2 of the gate electrode 350 may be lower than a vertical level of the frontside surface 102A of the substrate 102. The first vertical gate portion 350V1 may have a surface facing a fin sidewall of the first locally asymmetric fin region F31 of the first active region AC31, and the second vertical gate portion 350V2 may have a surface facing a fin sidewall of the second locally asymmetric fin region F32.

As illustrated in FIGS. 6B and 6C, the first locally cutout space CS31, the second locally cutout space CS32, the first locally asymmetric fin region F31, the second locally asymmetric fin region F32, and the gate electrode 350 may be provided to overlap the photodiode PD in a vertical direction (the Z direction). The barrier region 122 may be provided between the first active region AC31 and the photodiode PD.

A detailed configuration of the first active region AC31, the first locally asymmetric fin region F31, the second locally asymmetric fin region F32, the gate electrode 350, and the gate dielectric layer 328 of the source follower transistor SF3 is substantially the same as that of the first active region AC11, the locally asymmetric fin region F1, the gate electrode 150, and the gate dielectric layer 128 of the source follower transistor SF2 described above with reference to FIGS. 4A to 4F.

In the image sensor 300 according to example embodiments of the disclosure described above with reference to FIGS. 6A to 6E, the first active region AC31 may have an L-shaped planar shape including the bent portion BP3 and may include the first locally asymmetric fin region F31 limited by the first locally cutout space CS31 and the second locally asymmetric fin region F32 limited by the second locally cutout space CS32. In the first active region AC31, the first locally cutout space CS31 and the first locally asymmetric fin region F31 may each be provided in positions closer to the source region SFS than the first drain region SFD1, and the second locally cutout space CS32 and the second locally asymmetric fin region F32 may each be provided in positions closer to the source region SFS than the second drain region SFD2. In the source follower transistor SF3, the first locally asymmetric fin region F31 and the second locally asymmetric fin region F32 may be formed in positions adjacent to the source region SFS inside the bent portion BP3, which is a portion where current is concentrated in the first active region AC31. Accordingly, the source follower transistor SF3 may have a local FinFET structure in which partial regions of the gate electrode 350 cover only the fin upper surface and one fin sidewall of each of the first locally asymmetric fin region F31 and the second locally asymmetric fin region F32. Accordingly, even if the image sensor 300 is highly integrated and the size of the pixel region is miniaturized, noise characteristics of the pixel may be improved and electrical characteristics of the source follower transistor SF3 may be secured, without making the manufacturing process of the image sensor 300 difficult or incurring high manufacturing costs.

Figure 7:
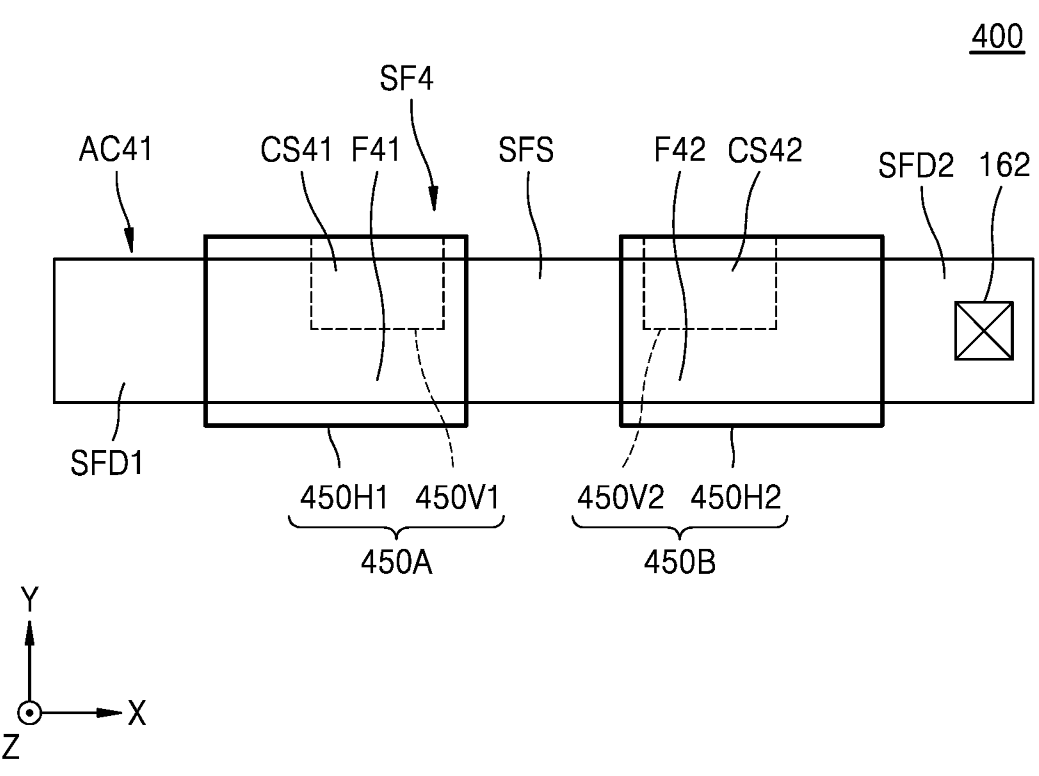
FIG. 7 is a plan layout illustrating an image sensor according to another example embodiment of the disclosure.

FIG. 7 is a planar layout illustrating an image sensor 400 according to another example embodiment of the disclosure. FIG. 7 illustrates a planar layout of a region corresponding to a partial region of the pixel region PXR illustrated in FIG. 4A.

Referring to FIG. 7, the image sensor 400 has substantially the same configuration as that of the image sensor 300 described above with reference to FIGS. 6A to 6E. However, the image sensor 400 may include a source follower transistor SF4 including a dual transistor in which two local transistors sharing one source region SFS formed in a first active region AC41 are connected in parallel.

In the image sensor 400, the first active region AC41 may have a rectangular planar shape, which extend in one selected horizontal direction (the X direction in FIG. 7). A first gate electrode 450A and a second gate electrode 450B configuring the two local transistors may be provided on the first active region AC41. That is, a length of the first active region AC41 in the X direction is longer than a width of the first active region AC41 in the Y direction. The first gate electrode 450A and the second gate electrode 450B may be apart from each other in a channel direction of the source follower transistor SF4 with the source region SFS therebetween.

The source region SFS may be provided between the first gate electrode 450A and the second gate electrode 450B of the first active region AC41, and the first drain region SFD1 may be provided at one end and the second drain region SFD2 may be provided at the other end of the first active region AC41 in the selected horizontal direction (the X direction).

In the first active region AC41, a first locally cutout space CS41 may be provided in a position closer to the source region SFS, among the source region SFS and the first drain region SFD1, between the source region SFS and the first drain region SFD1, and a second locally cutout space CS42 may be provided in a position closer to the source region SFS, among the source region SFS and the second drain region SFD2, between the source region SFS and the second drain region SFD2. A width of each of the first locally asymmetric fin region F41 and the second locally asymmetric fin region F32 in the first active region AC41 may be limited by the first locally cutout space CS41 and the second locally cutout space CS42.

The first gate electrode 450A may include a first horizontal gate 450H1 covering an upper surface of the first locally asymmetric fin region F41 and a first vertical gate portion 450V1 integrally connected to the first horizontal gate 450H1 and filling the first locally cutout space CS41. The first vertical gate portion 450V1 may have a sidewall facing a fin sidewall of the first locally asymmetric fin region F41 in the first locally cutout space CS41. The second gate electrode 450B may include a second horizontal gate 450H2 covering an upper surface of the second locally asymmetric fin region F41 and a second vertical gate portion 450V2 integrally connected to the second horizontal gate 450H2 and filling the second locally cutout space CS42. The second vertical gate portion 450V2 may have a sidewall facing a fin sidewall of the second locally asymmetric fin region F42 in the second locally cutout space CS42.

The first locally cutout space CS41 and the first locally asymmetric fin region F41 may be provided in a position closer to the source region SFS between the source region SFS and the first drain region SFD1, and the second locally cutout space CS42 and the second locally asymmetric fin region F42 may be provided in a position closer to the source region SFS between the source region SFS and the second drain region SFD2.

A gate dielectric layer may be between the first active region AC41 and the first gate electrode 450A and between the first active region AC41 and the second gate electrode 450B.

A detailed configuration of the first active region AC41, the first and second locally asymmetric fin regions F41 and F42, and the first and second gate electrodes 450A and 450B of the source follower transistor SF4 is the same as that of the first active region AC11, the locally asymmetric fin region F1, and the gate electrode 150 of the source follower transistor SF2 described above with reference to FIGS. 4A to 4F.

Figure 8:
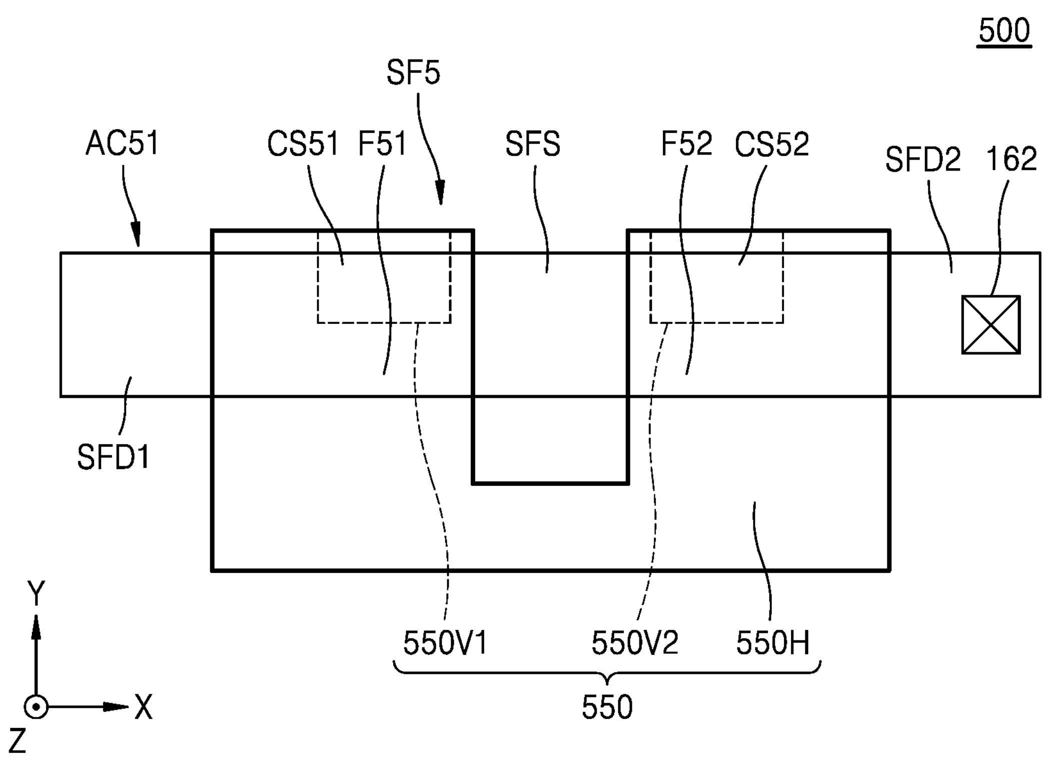
FIG. 8 is a planar layout illustrating an image sensor according to another example embodiment of the disclosure.

FIG. 8 is a plan layout illustrating an image sensor 500 according to another example embodiment of the disclosure. FIG. 8 illustrates a planar layout of a region corresponding to a partial region of the pixel region PXR illustrated in FIG. 4A.

Referring to FIG. 8, the image sensor 500 has substantially the same configuration as that of the image sensor 300 described above with reference to FIGS. 6A to 6E. However, the image sensor 500 may include a source follower transistor SF5 including a dual transistor in which two local transistors sharing one source region SFS formed in a first active region AC51 are connected in parallel.

In the image sensor 500, the first active region AC51 may have a rectangular planar shape which extends in one selected horizontal direction (the X direction in FIG. 5). That is, a length of the first active region AC51 in the X direction is longer than a width of the first active region AC51 in the Y direction. A gate electrode 550 configuring the two local transistors may be provided on the first active region AC51. The gate electrode 550 may include one horizontal gate portion 550H and a first vertical gate portion 550V1 and a second vertical gate portion 550V2 integrally connected to the horizontal gate portion 550H. The horizontal gate portion 550H of the gate electrode 550 may include first portions apart from each other in a channel direction of the source follower transistor SF4 with the source region SFS therebetween and covering an upper surface of the first active region AC51 and a second portion connecting the first portions. The second portion may not cover the upper surface of the first active region AC51.

The first drain region SFD1 may be provided at one end of the first active region AC51, and the second drain region SFD2 may be provided at the other end of the first active region AC51. In the first active region AC51, a first locally cutout space CS51 may be provided in a position closer to the source region SFS, among the source region SFS and the first drain region SFD1, between the source region SFS and the first drain region SFD1, and a second locally cutout space CS52 may be provided in a position closer to the source region SFS, among the source region SFS and the second drain region SFD2, between the source region SFS and the second drain region SFD2. A width of each of the first locally asymmetric fin region F51 and the second locally asymmetric fin region F52 in the first active region AC51 may be limited by the first locally cutout space CS51 and the second locally cutout space CS52.

The first vertical gate portion 550V1 of the gate electrode 550 may have a sidewall facing the fin sidewall of the first locally asymmetric fin region F51 in the first locally cutout space CS51. The second vertical gate portion 550V2 of the gate electrode 550 may have a sidewall facing the fin sidewall of the second locally asymmetric fin region F52 in the second locally cutout space CS52.

The first locally cutout space CS51 and the first locally asymmetric fin region F51 may be provided in a position closer to the source region SFS between the source region SFS and the first drain region SFD1, and the second locally cutout space CS52 and the second locally asymmetric fin region F52 may be provided in a position closer to the source region SFS between the source region SFS and the second drain region SFD2. A gate dielectric layer may be between the first active region AC51 and the gate electrode 550.

A detailed configuration of the first active region AC51, the first and second locally asymmetric fin regions F51 and F52, and the second gate electrode 550 of the source follower transistor SF5 is substantially the same as that of the first active region AC11, the locally asymmetric fin region F1, and the gate electrode 150 of the source follower transistor SF2 described above with reference to FIGS. 4A to 4F.

In the image sensors 400 and 500 according to example embodiments of the disclosure described above with reference to FIGS. 7 and 8, similar to the image sensors 100, 200, and 300 described above with reference to FIGS. 4A to 6E, even if the image sensors 400 and 500 are highly integrated and the size of the pixel region is miniaturized, noise characteristics of the pixel may be improved and electrical characteristics of the source follower transistor SF3 may be secured, without making the manufacturing process of the image sensors 400 and 500 difficult or incurring high manufacturing costs.

FIGS. 9A to 9H are cross-sectional views illustrating a method of manufacturing an image sensor, according to example embodiments of the disclosure. An exemplary manufacturing method of the image sensor 100 described above with reference to FIGS. 4A to 4F is described with reference to FIGS. 9A to 9H. FIGS. 9A to 9H illustrate a cross-sectional configuration according to a process order of a region corresponding to a cross-section taken along line Y12-Y12' of FIG. 4D.

Figure 9A:
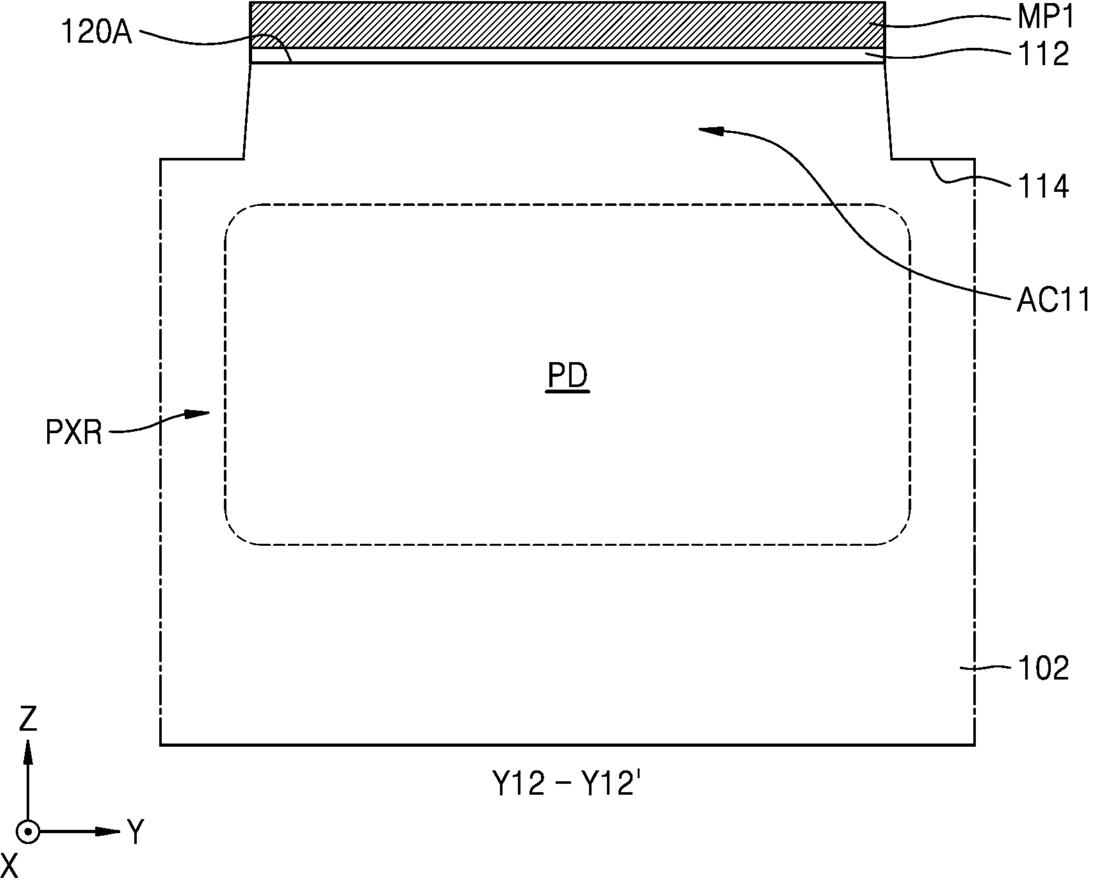
FIGS. 9A to 9H are cross-sectional views illustrating a method of manufacturing an image sensor, according to example embodiments of the disclosure.

Referring to FIG. 9A, a photodiode PD may be formed in a substrate 102, a buffer oxide film 112 and a mask pattern MP1 may be formed on a frontside surface 102A of the substrate 102, and the substrate 102 may be anisotropically etched using the mask pattern MP1 as an etch mask to form a device isolation trench 114. A plurality of active regions AC11, AC12, and AC13 (refer to FIG. 4A) may be defined in the substrate 102 by the device isolation trench 114. According to an example embodiment, an N-type impurity may be doped into a partial region of the substrate 102 to form the photodiode PD.

According to an example embodiment, the mask pattern MP1 may include a silicon nitride layer or a silicon oxynitride layer. The lowermost surface of the device isolation trench 114 may be formed to be apart from the photodiode PD. The process of forming the isolation trench 114 may be performed before or after the process of forming the photodiode PD.

Figure 9B:
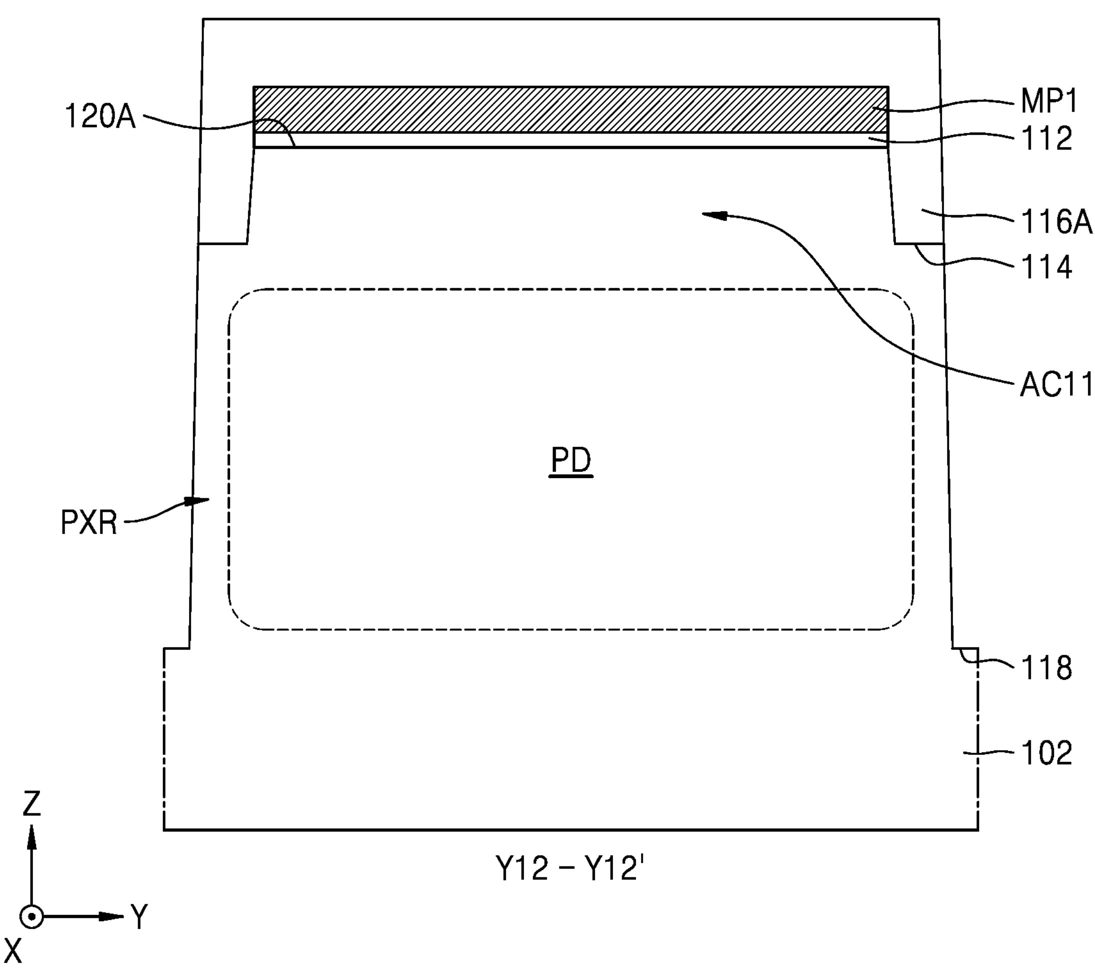

Referring to FIG. 9B, in a resultant structure of FIG. 9A, a device isolation insulating layer 116A may be formed to fill the device isolation trench 114 and cover an upper surface of the mask pattern MP1, and a portion of the device isolation insulating layer 116A and a portion of the substrate 102 may be etched to form a pixel isolation trench 118. The pixel isolation trench 118 may be formed to surround the photodiode PD at the periphery of the photodiode PD. A pixel region PXR may be defined in the substrate 102 by the pixel isolation trench 118.

Figure 9C:
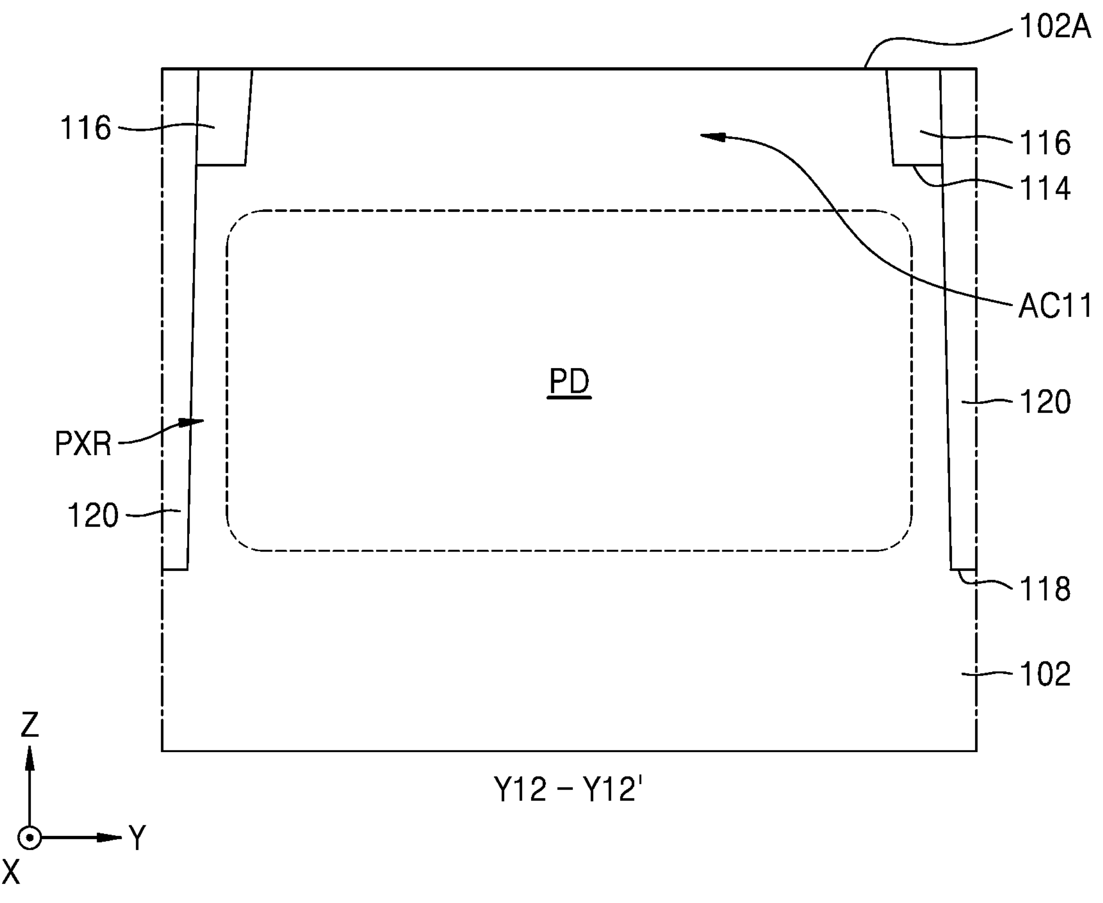

Referring to FIG. 9C, after an insulating layer filling the pixel isolation trench 118 is formed in the resultant structure of FIG. 9B, the mask pattern MP1 and the buffer oxide film 112 are removed, while planarizing the resultant structure in which the insulating layer is formed, thereby exposing the frontside surface 102A of the substrate 102. As a result, a portion of the device isolation insulating layer 116A that fills the device isolation trench 114 may remain as a device isolation insulating structure 116, and a portion of the insulating layer that fills the pixel isolation trench 118 may remain as a pixel isolation insulating layer 120.

Alternatively, a process of implanting P-type impurities into the substrate 102 may be performed to form the device isolation insulating structure 116.

Figure 9D:
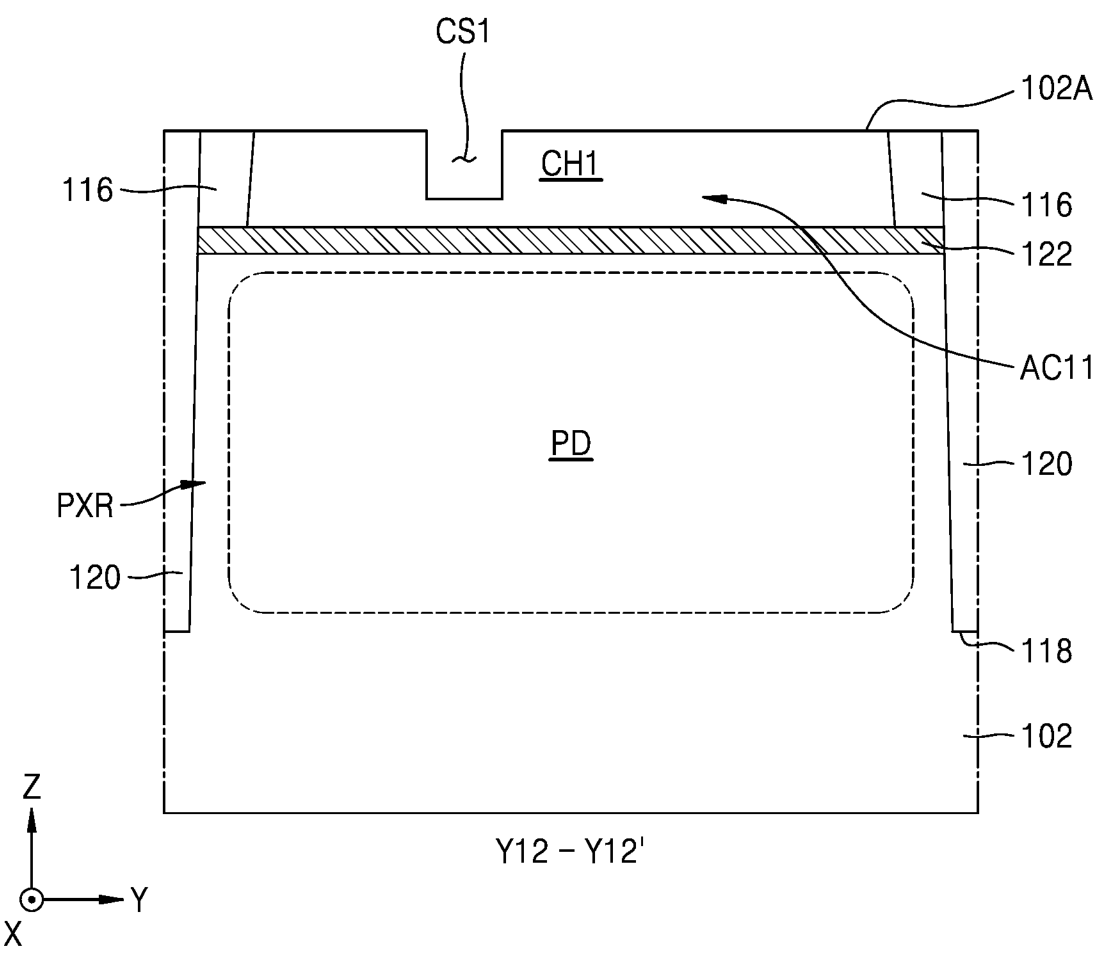

Referring to FIG. 9D, in the resultant structure of FIG. 9C, P-type impurities may be implanted into the substrate 102 to form a barrier region 122 on the photodiode PD, and a portion of one edge portion of the first active region AC11 may be removed from the frontside surface 102A of the substrate 10 to form a locally cutout space CS1. By forming the locally cutout space CS1, a locally asymmetric fin region F1 (refer to FIGS. 4B and 4E) defined by the locally cutout space CS1 may be formed in the first active region AC11. The locally asymmetric fin region F1 may be formed in a position shifted to the edge portion side of the first active region AC11 from the center of the first active region AC11 in a direction (the X direction in FIGS. 4A to 4F and FIG. 9D) perpendicular to a channel direction in the first active region AC11.

For example, unlike the process of FIG. 9D in which the locally cutout space CS1 is formed by removing a portion of only one edge portion of the first active region AC11, if a fin region is formed in the active region AC11 by forming a pair of locally cutout spaces by removing a portion from each of both edge portions of the first active region AC11, pitches of the regions to be etched is small in the etching process for forming the fin region may be reduced to increase process difficulty, and because relatively expensive equipment should be used, costs of the process may increase. In the method of manufacturing the image sensor 100 according to example embodiments of the disclosure, the locally cutout space CS1 is formed in only one edge portion of the first active region AC11 to form the locally asymmetric fin region F1, and therefore, even if the image sensor 100 is highly integrated and the size of the pixel region PXR is miniaturized, an increase in process difficulty and/or an increase in manufacturing costs of the image sensor 100 may be suppressed.

Figure 9E:
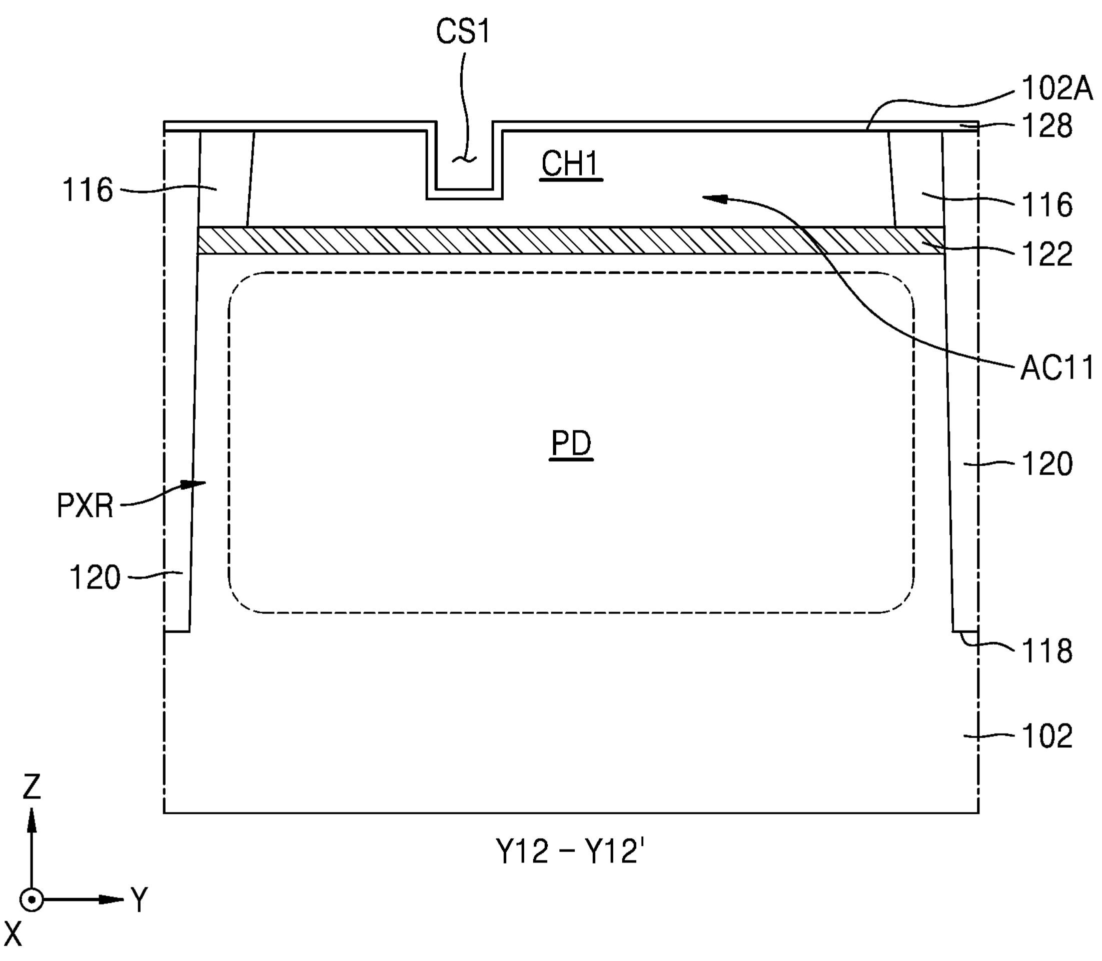

Referring to FIG. 9E, in a resultant structure of FIG. 9D, a gate dielectric layer 128 may be formed to conformally cover an inner surface of the locally cutout space CS1 and the frontside surface 102A of the substrate 102.

During the formation of the gate dielectric layer 128, gate dielectric layers configuring the first and second transfer transistors TX1 and TX2, the selection transistor SX, and the reset transistor RX described above with reference to FIG. 2 or gate dielectric layers configuring the first to fourth transfer transistors TX1, TX2, TX3, and TX4 the selection transistor SX, and the reset transistor RX described above with reference to FIG. 3 may be simultaneously formed.

Figure 9F:
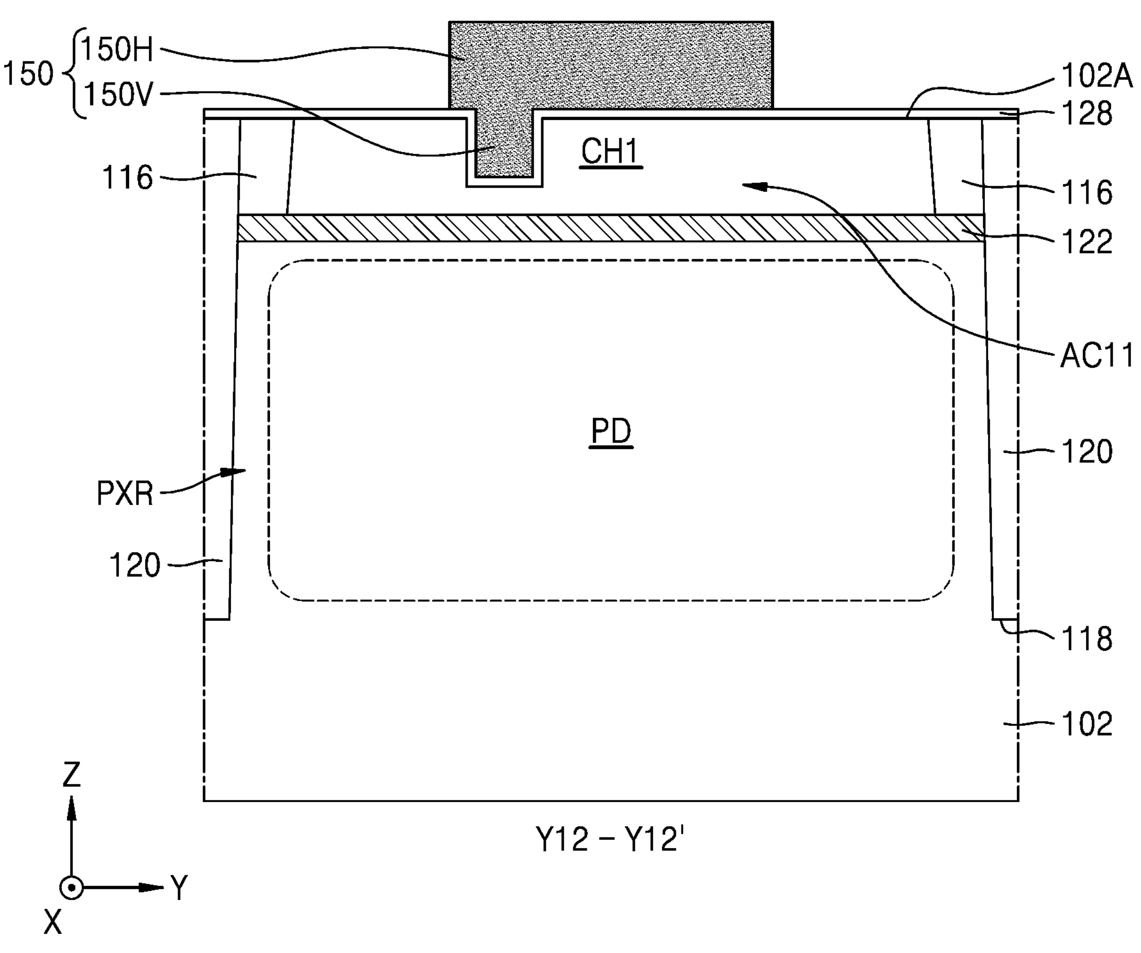

Referring to FIG. 9F, a gate electrode 150 may be formed on the gate dielectric layer 128. The gate electrode 150 may include a horizontal gate portion 150H covering an upper surface of the first active region AC11 and a vertical gate portion 150V integrally connected to the horizontal gate portion 150H and filling the locally cutout space CS1 on the gate dielectric layer 128.

During the formation of the gate electrode 150, gate structures configuring MOS transistors configuring readout circuits may be formed together on the frontside surface 102A of the substrate 102. For example, while forming the gate electrode 150, gate structures configuring the first and second transfer transistors TX1 and TX2, the selection transistor SX, and the reset transistor RX described above with reference to FIG. 2 or gate structures configuring gate structures configuring the first to fourth transfer transistors TX1, TX2, TX3, and TX4, the selection transistor SX, and the reset transistor RX described above with reference to FIG. 3 may be simultaneously formed.

Figure 9G:
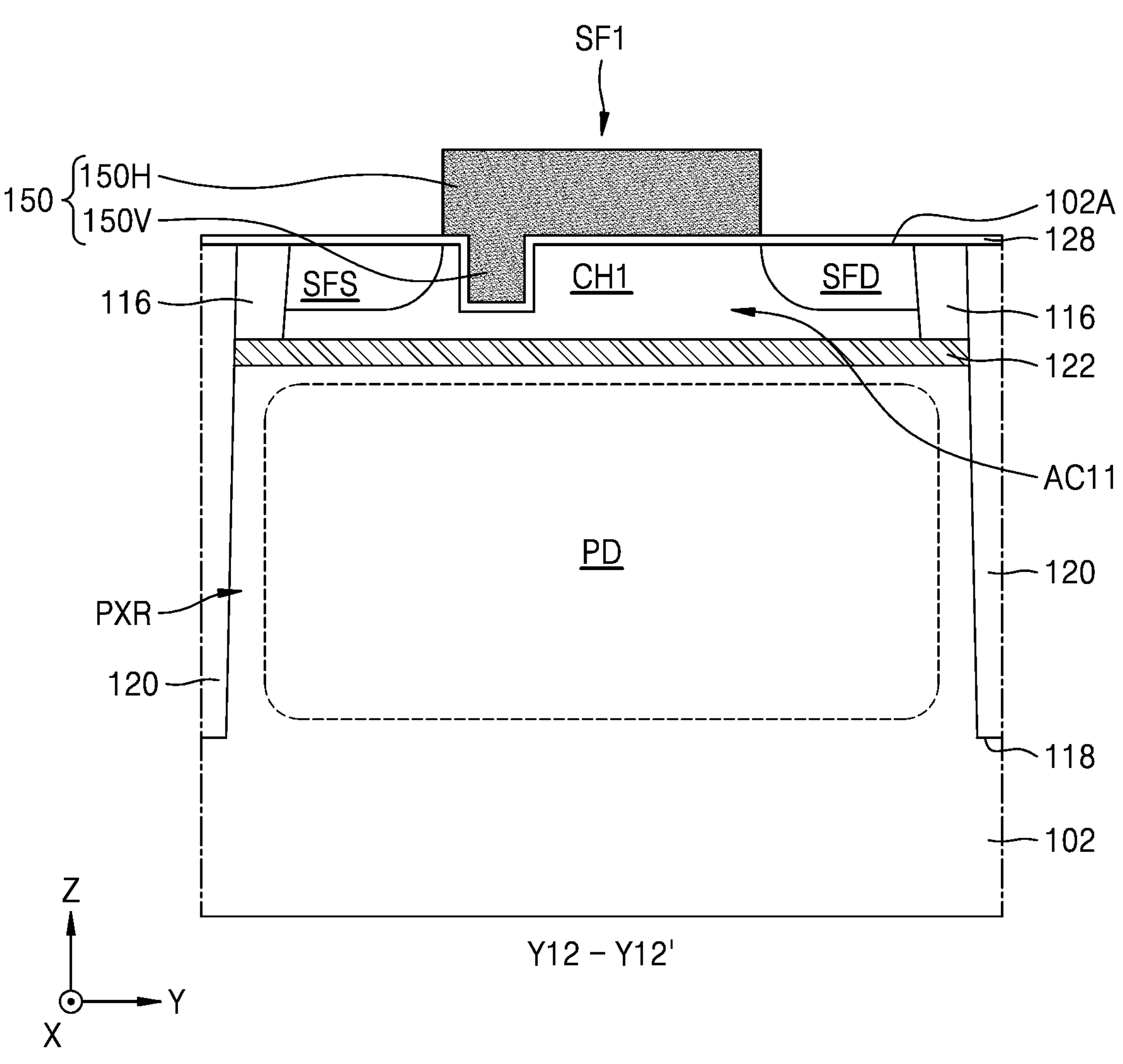

Referring to FIG. 9G, in a resultant structure of FIG. 9F, impurity ions may be implanted into the active regions AC11, AC12, and AC13 (refer to FIG. 4A) including the first active region AC11 to form a plurality of impurity regions. The impurity regions may include a source region SFS and a drain region SFD. By forming the source region SFS and the drain region SFD, the source follower transistor SF1 provided on the first active region AC11 may be obtained.

Figure 9H:
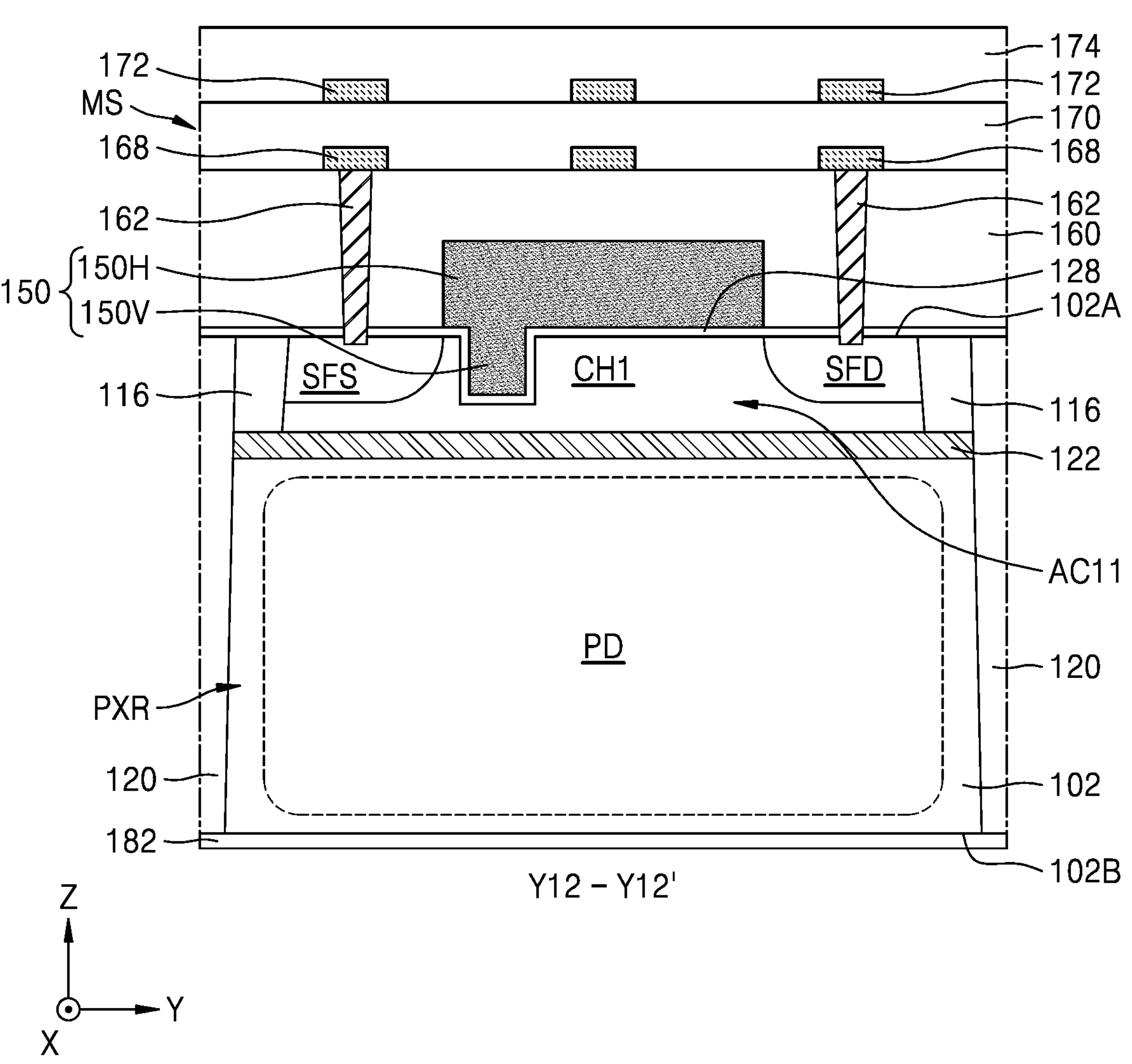

Referring to FIG. 9H, in a resultant structure of FIG. 9G, after an interlayer insulating layer 160 covering the frontside surface 102A of the substrate 102 and a plurality of transistors including the source follower transistor SF1 is formed, a plurality of contact plugs 162 connected to the transistors through the interlayer insulating layer 160 may be formed, and a plurality of conductive lines 168 may be formed on the interlayer insulating layer 160. The conductive lines 168 may be configured to be connectable to the transistors through the contact plugs 162.

The contact plugs 162 may include contact plugs 162 connected to each of the horizontal gate portion 150H, the source region SFS, and the drain region SFD of the source follower transistor SF1. According to an example embodiment, the contact plugs 162 may include each of the impurity regions and gate structures configuring the first and second transfer transistors TX1 and TX2, the selection transistor SX, and the reset transistor RX described above with reference to FIG. 2, and contact plugs 162 connected to each of the impurity regions and gate structures configuring the first to fourth transfer transistors TX1, TX2, TX3, and TX4, the selection transistor SX, and the reset transistor RX described above with reference to FIG. 3. While the contact plugs 162 are formed, the contact plugs 164 illustrated in FIG. 4A may also be formed.

Thereafter, a plurality of interlayer insulating layers 170 and 174 and a plurality of conductive lines 172 may be formed. The interlayer insulating layers 170 and 174 and the conductive lines 172 may configure a wiring structure MS covering the frontside surface 102A of the substrate 102 together with the interlayer insulating layer 160 and the conductive lines 168.

After the wiring structure MS is formed, a thickness of the substrate 102 may be reduced in a state in which a support substrate is adhered on the wiring structure MS. To this end, a mechanical grinding process, a chemical mechanical polishing (CMP) process, a wet etching process, or a combination thereof may be used. As a result, the pixel isolation insulating layer 120 may be exposed to a backside surface 102B, which is a surface opposite to the frontside surface 102A of the substrate 102. A first planarization layer 182 may be formed on the exposed backside surface 102B of the substrate 102 and the exposed surface of the pixel isolation insulating layer 120.

Thereafter, as illustrated in FIGS. 4B to 4D, an anti-reflection layer 186, a color filter CF, a second planarization layer 184, a microlens ML, and a protective capping layer 188 may be sequentially formed on the first planarization layer 182 to form a light transmitting structure LTS. Thereafter, the support substrate covering the wiring structure MS may be removed to manufacture the image sensor 100 described above with reference to FIGS. 4A to 4F.

Although the method of manufacturing the image sensor 100 illustrated in FIGS. 4A to 4F has been described with reference to FIGS. 9A to 9H, it may be well known by those skilled in the art that the image sensors 200, 300, 400, and 500 described above with reference to FIGS. 5A to 8 through various modifications and changes within the scope of the technical spirit of the disclosure and variably modified and changed image sensors may be manufactured within the scope of the technical spirit of the disclosure therefrom.

Figure 10A:
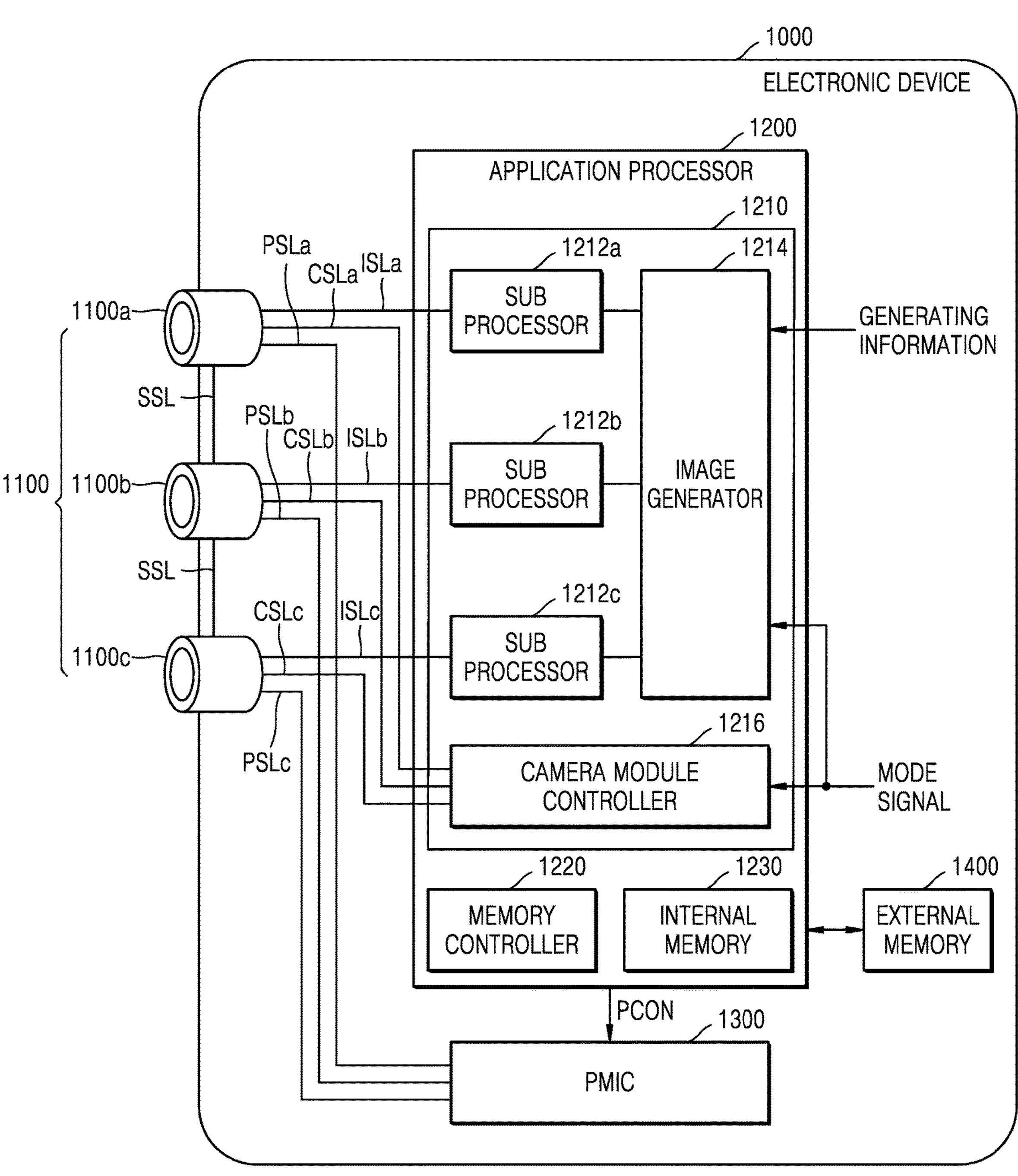
FIG. 10A is a block diagram of an electronic system according to example embodiments of the disclosure.
Figure 10B:
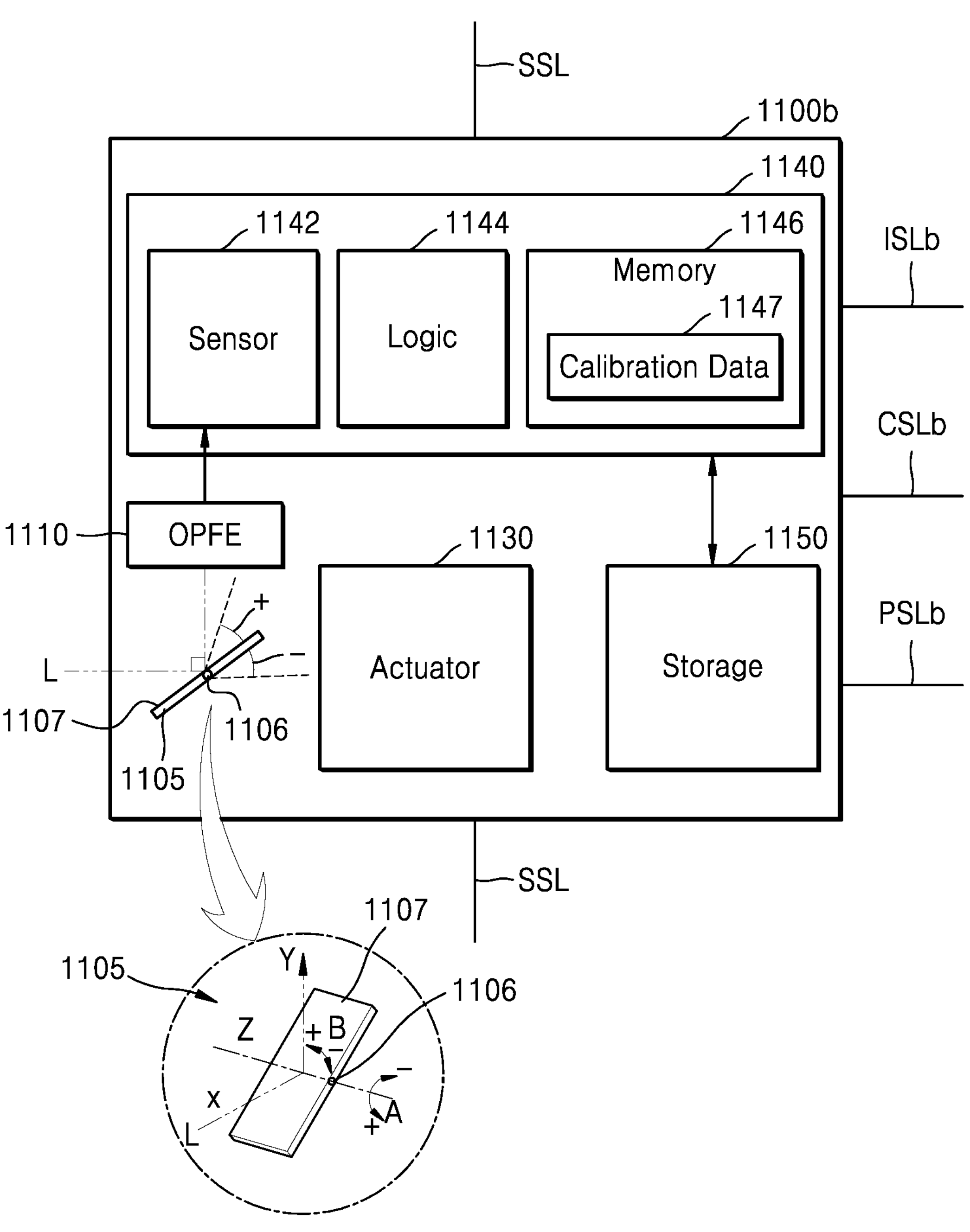
FIG. 10B is a detailed block diagram of a camera module included in the electronic system of FIG. 10A, according to an example embodiment.

FIG. 10A is a block diagram of an electronic system 1000 according to example embodiments of the disclosure. FIG. 10B is a detailed block diagram of a camera module included in the electronic system 1000 of FIG. 10A.

Referring to FIG. 10A, the electronic system 1000 may include a camera module group 1100, an application processor 1200, a power management integrated circuit (PMIC) 1300, and an external memory 1400.

The camera module group 1100 may include a plurality of camera modules 1100*a*, 1100*b*, and 1100*c*. Although three camera modules 1100*a*, 1100*b*, and 1100*c* are illustrated in FIG. 10A, example embodiments of the disclosure are not limited thereto. In some example embodiments, the camera module group 1100 may be modified to include only two camera modules. In some example embodiments, the camera module group 1100 may be modified to include "n" camera modules, where "n" is a natural number of at least 4.

The detailed configuration of the camera module 1100*b* will be described with reference to FIG. 10B below. The descriptions below may also be applied to the other camera modules 1100*a* and 1100*c*.

Referring to FIG. 10B, the camera module 1100*b* may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some example embodiments, the prism 1105 may change the path of the light L incident in a first direction (an X direction in FIG. 10B) into a second direction (a Y direction in FIG. 10B) perpendicular to the first direction. The prism 1105 may rotate the reflective surface 1107 of the light reflecting material in a direction A around a central shaft 1106 or rotate the central shaft 1106 in a direction B to change the path of the light L incident in the first direction (the X direction) into the second direction (the Y direction) perpendicular to the first direction (the X direction). In this case, the OPFE 1110 may move in a third direction (a Z direction in FIG. 10B), which is perpendicular to the first direction (the X direction) and the second direction (the Y direction).

In some example embodiments, as illustrated in FIG. 10B, an A-direction maximum rotation angle of the prism 1105 may be less than or about equal to 15 degrees in a plus (+) A direction and greater than 15 degrees in a minus (−) A direction. However, example embodiments of the disclosure are not limited thereto.

In some example embodiments, the prism 1105 may move by an angle of about 20 degrees or in a range from about 10 degrees to about 20 degrees or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction.

In some example embodiments, the prism 1105 may move the reflective surface 1107 of the light reflecting material in the third direction (the Z direction) parallel with an extension direction of the central shaft 1106.

The OPFE 1110 may include, for example, "m" optical lenses, where "m" is a natural number. The "m" lenses may move in the second direction (the Y direction) and change an optical zoom ratio of the camera module 1100*b*. For example, when the default optical zoom ratio of the camera module 1100*b* is Z, the optical zoom ratio of the camera module 1100*b* may be changed to 3Z or 5Z or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. The control logic 1144 may control all operations of the camera module 1100*b*. For example, the control logic 1144 may control operation of the camera module 1100*b* according to a control signal provided through a control signal line CSLb.

The memory 1146 may store information, such as calibration data 1147, utilized for the operation of the camera module 1100*b*. The calibration data 1147 may include information, which is utilized for the camera module 1100*b*, to generate image data using the light L provided from outside. For example, the calibration data 1147 may include information about the degree of rotation, information about a focal length, information about an optical axis, or the like. When the camera module 1100*b* is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some example embodiments, although the storage 1150 may include electrically erasable programmable read-only memory (EEPROM), example embodiments of the disclosure are not limited thereto.

The image sensor 1142 may include the image sensor 100, 200, 300, 400, or 500 described with reference to FIGS. 1 to 8, or an image sensor variously modified and changed therefrom within the scope of the disclosure.

Referring to FIGS. 10A and 10B, in some example embodiments, each of the camera modules 1100*a*, 1100*b*, and 1100*c* may include the actuator 1130. Accordingly, the camera modules 1100*a*, 1100*b*, and 1100*c* may include the calibration data 1147, which is the same or different among the camera modules 1100*a*, 1100*b*, and 1100*c* according to the operation of the actuator 1130 included in each of the camera modules 1100*a*, 1100*b*, and 1100*c*.

In some example embodiments, one (e.g., the camera module 1100*b*) of the camera modules 1100*a*, 1100*b*, and 1100*c* may be of a folded-lens type including the prism 1105 and the OPFE 1110, while the other camera modules (e.g., the camera modules 1100*a* and 1100*c*) may be of a vertical type that does not include the prism 1105 and the OPFE 1110. However, example embodiments of the disclosure are not limited thereto.

In some example embodiments, one (e.g., the camera module 1100c) of the camera modules 1100a, 1100b, and 1100c may include a vertical depth camera, which extracts depth information using an infrared (IR) ray. In this case, the application processor 1200 may generate a three-dimensional (3D) depth image by merging image data provided from the depth camera with image data provided from another camera module (e.g., the camera module 1100a or 1100b).

In some example embodiments, at least two camera modules (e.g., 1100a and 1100b) among the camera modules 1100a, 1100b, and 1100c may have different field-of-views. In this case, for example, the two camera modules (e.g., 1100a and 1100b) among the camera modules 1100a, 1100b, and 1100c may respectively have different optical lenses. However, example embodiments of the disclosure are not limited thereto.

In some example embodiments, the camera modules 1100a, 1100b, and 1100c may have different field-of-views from one another. In this case, although the camera modules 1100a, 1100b, and 1100c may respectively have different optical lenses, example embodiments of the disclosure are not limited thereto.

In some example embodiments, the camera modules 1100a, 1100b, and 1100c may be physically separated from one another. In other words, the sensing region of the image sensor 1142 is not divided and used by the camera modules 1100a, 1100b, and 1100c, but the image sensor 1142 may be independently included in each of the camera modules 1100a, 1100b, and 1100c.

Referring back to FIG. 10A, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub-processors 1212a, 1212b, and 1212c, an image generator 1214, and a camera module controller 1216. The image processing unit 1210 may include as many sub-processors 1212a, 1212b, and 1212c as the camera modules 1100a, 1100b, and 1100c.

Pieces of image data respectively generated by the camera modules 1100a, 1100b, and 1100c may be respectively provided to the sub-processors 1212a, 1212b, and 1212c through image signal lines ISLa, ISLb, and ISLc separated from each other. For example, image data generated by the camera module 1100a may be provided to the sub-processor 1212a through the image signal line ISLa, image data generated by the camera module 1100b may be provided to the sub-processor 1212b through the image signal line ISLb, and image data generated by the camera module 1100c may be provided to the sub-processor 1212c through the image signal line ISLc. Such image data transmission may be performed using, for example, a mobile industry processor interface (MIPI) based camera serial interface (CSI). However, example embodiments of the disclosure are not limited thereto.

In some example embodiments, a single sub-processor may be provided for a plurality of camera modules. For example, in an embodiment, the sub-processors 1212a and 1212c may not be separated but may be integrated into a single sub-processor, and the image data provided from the camera module 1100a or the camera module 1100c may be selected by a selection element (e.g., a multiplexer) and then provided to the integrated sub-processor.

The image data provided to each of the sub-processors 1212a, 1212b, and 1212c may be provided to the image generator 1214. The image generator 1214 may generate an output image using the image data provided from each of the sub-processors 1212a, 1212b, and 1212c according to image generation information or a mode signal.

For example, the image generator 1214 may generate the output image by merging at least portions of respective pieces of image data, which are respectively generated by the camera modules 1100a, 1100b, and 1100c having different field-of-views, according to the image generation information or the mode signal. Alternatively, the image generator 1214 may generate the output image by selecting one of pieces of image data, which are respectively generated by the camera modules 1100a, 1100b, and 1100c having different field-of-views, according to the image generation information or the mode signal.

In some example embodiments, the image generation information may include a zoom signal or a zoom factor. In some example embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge image data output from the camera module 1100a and image data output from the camera module 1100c and then generate an output image by using a merged image signal and image data output from the camera module 1100b and not used for merging. When the zoom signal is a second signal different from the first signal, the image generator 1214 may generate an output image by selecting one of the pieces of image data respectively output from the camera modules 1100a, 1100b, and 1100c, instead of performing the merging. However, example embodiments of the disclosure are not limited thereto, and a method of processing image data may be changed according to embodiments.

In some example embodiments, the image generator 1214 may receive a plurality of pieces of image data, which have different exposure times, from at least one of the sub-processors 1212a, 1212b, and 1212c, and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to the mode signal or the image generation signal including a zoom signal, and the other camera modules (e.g., the camera modules 1100a and 1100c) may be designated as slave cameras. Such designation information may be included in a control signal and provided to each of the camera modules 1100a, 1100b, and 1100c through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100*a* is greater than that of the camera module 1100*b* and the zoom factor indicates a low zoom ratio, the camera module 1100*a* may operate as a master and the camera module 1100*b* may operate as a slave. In contrast, when the zoom factor indicates a high zoom ratio, the camera module 1100*b* may operate as a master and the camera module 1100*a* may operate as a slave.

In some example embodiments, a control signal provided from the camera module controller 1216 to each of the camera modules 1100*a*, 1100*b*, and 1100*c* may include a sync enable signal. For example, when the camera module 1100*b* is a master camera and the camera module 1100*a* is a slave camera, the camera module controller 1216 may transmit the sync enable signal to the camera module 1100*b*. The camera module 1100*b* provided with the sync enable signal may generate a sync signal based on the sync enable signal and may provide the sync signal to the camera modules 1100*a* and 1100*c* through a sync signal line SSL. The camera modules 1100*a*, 1100*b*, and 1100*c* may be synchronized with the sync signal and may transmit image data to the application processor 1200.

In some example embodiments, a control signal provided from the camera module controller 1216 to each of the camera modules 1100*a*, 1100*b*, and 1100*c* may include mode information according to the mode signal. The camera modules 1100*a*, 1100*b*, and 1100*c* may operate in a first operation mode or a second operation mode in relation with a sensing speed based on the mode information.

In the first operation mode, the camera modules 1100*a*, 1100*b*, and 1100*c* may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be about 30 times or less the first speed.

The application processor 1200 may store the received image signal, e.g., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212*a*, 1212*b*, and 1212*c* of the image processing unit 1210 may perform the decoding and may also perform image processing on the decoded image signal.

In the second operation mode, the camera modules 1100*a*, 1100*b*, and 1100*c* may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100*a*, 1100*b*, and 1100*c*. For example, under the control of the application processor 1200, the PMIC 1300 may provide first power to the camera module 1100*a* through a power signal line PSLa, second power to the camera module 1100*b* through a power signal line PSLb, and third power to the camera module 1100*c* through a power signal line PSLc.

The PMIC 1300 may generate power corresponding to each of the camera modules 1100*a*, 1100*b*, and 1100*c* and adjust the level of the power, in response to a power control signal PCON from the application processor 1200. The power control signal PCON may include a power adjustment signal for each operation mode of the camera modules 1100*a*, 1100*b*, and 1100*c*. For example, the operation mode may include a low-power mode. In this case, the power control signal PCON may include information about a camera module to operate in the low-power mode and a power level to be set. The same or different levels of power may be respectively provided to the camera modules 1100*a*, 1100*b*, and 1100*c*. The level of power may be dynamically changed.

While the inventive concept has been particularly shown and described with reference to embodiments thereof, it will be understood that various changes in form and details may be made therein without departing from the spirit and scope of the following claims.

What is claimed is:

1. An image sensor comprising:

a substrate having a pixel region;

an active region in the pixel region, the active region having an edge portion in a direction perpendicular to a channel direction in the active region, and the active region having an asymmetric fin region configured by a cutout space at the edge portion of the active region and shifted from a center of the active region; and a transistor provided in the pixel region, wherein the transistor comprises:

a gate electrode comprising:

a horizontal gate portion provided on the active region and having a first surface facing an upper surface of the active region, and a vertical gate portion filling the cutout space and having a second surface facing a fin sidewall among a plurality of fin sidewalls of the asymmetric fin region;

a source region and a drain region formed in the active region, the source region being formed on a first side of the gate electrode and the drain region formed on a second side of the gate electrode opposite to the first side; and a gate dielectric layer provided between the active region and the gate electrode, and wherein a first distance between the source region and the asymmetric fin region is different from a second distance between the drain region and the asymmetric fin region.

2. The image sensor of claim 1, wherein the first distance is a distance from the asymmetric fin region to the source region in a channel direction in the active region, and the second distance is a distance from the asymmetric fin region to the drain region in the channel direction in the active region, and wherein the first distance is smaller than the second distance.

3. The image sensor of claim 1, wherein, the active region has two edge portions in the direction perpendicular to the channel direction in the active region, and wherein the cutout space is formed in only one of the two edge portions.

4. The image sensor of claim 1, wherein:

the horizontal gate portion of the gate electrode is provided on a fin upper surface of the asymmetric fin region, the vertical gate portion of the gate electrode is provided on a first fin sidewall, among the plurality of fin sidewalls of the asymmetric fin region, facing the cutout space, and a device isolation insulating structure is provided on a second fin sidewall on an opposite side of the first fin sidewall, among the plurality of fin sidewalls.

5. The image sensor of claim 1, wherein:

the active region has a rectangular planar shape such that a length of the active region in a first horizontal direction is longer than a width of the active region in a second horizontal direction perpendicular to the first horizontal direction, the source region is provided at one end of the active region in the first horizontal direction, the drain region is provided at another end of the active region in the first horizontal direction, and the asymmetric fin region is closer to the source region than to the drain region in the active region.

6. The image sensor of claim 1, wherein:

the active region has an L-shaped planar shape comprising a bent portion, the transistor is configured such that a channel is formed in a direction bent along the L-shaped planar shape of the active region, the source region is provided at one end of the active region, the drain region is provided at another end of the active region, and the asymmetric fin region is closer to the source region than to the drain region in the active region.

7. The image sensor of claim 6, wherein:

in a top view of the substrate, the active region has an inner edge portion connected to an inner side of the bent portion and an outer edge portion connected to an outer side of the bent portion, the cutout space is formed in the inner edge portion of the active region, and another fin sidewall, among the plurality of fin sidewalls of the asymmetric fin region, configures the outer edge portion of the active region.

8. The image sensor of claim 1, wherein:

the transistor comprises a dual transistor in which two local transistors sharing the source region are connected in parallel, the drain region comprises a first drain region provided at one end of the active region and a second drain region provided at another end of the active region, and the asymmetric fin region comprises a first asymmetric fin region provided in a first position closer to the source region between the source region and the first drain region, and a second asymmetric fin region provided in a second position closer to the source region between the source region and the second drain region.

9. The image sensor of claim 8, wherein:

the horizontal gate portion of the gate electrode is provided on an upper surface of each of the first asymmetric fin region and the second asymmetric fin region, and the vertical gate portion of the gate electrode comprises:

a first vertical gate portion integrally connected to the horizontal gate portion and having a surface facing a first fin sidewall of the first asymmetric fin region; and a second vertical gate portion integrally connected to the horizontal gate portion and having a surface facing a second fin sidewall of the second asymmetric fin region.

10. The image sensor of claim 8, wherein the transistor comprises a first gate electrode provided between the source region and the first drain region, and a second gate electrode provided between the source region and the second drain region, and wherein the first gate electrode and the second gate electrode are spaced apart from each other with the source region provided between the first gate electrode and the second gate electrode.

11. The image sensor of claim 1, wherein:

the transistor comprises a dual transistor in which two local transistors sharing the source region are connected in parallel, the active region has an L-shaped planar shape comprises a bent portion, and in a top view, the active region comprises an inner edge portion connected to an inner side of the bent portion and an outer edge portion connected to an outer side of the bent portion, the drain region comprises a first drain region provided at one end of the active region, and a second drain region provided at the other end of the active region, and the asymmetric fin region comprises:

a first asymmetric fin region provided between the source region and the first drain region and closer to the source region than the first drain region in a first position closer to the inner edge portion than the outer edge portion of the active region; and a second asymmetric fin region provided between the source region and the second drain region and closer to the source region than the second drain region in a second position closer to the inner edge portion than the outer edge portion of the active region.

12. An image sensor comprising:

a substrate having a pixel region;

an active region provided in the pixel region, the active region having an edge portion in a direction perpendicular to a channel direction in the active region, and the active region having an asymmetric fin region configured by a cutout space at the edge portion of the active region and shifted from a center of the active region; and a source follower transistor provided in the pixel region, wherein the source follower transistor comprises:

a gate electrode comprising:

a horizontal gate portion provided on the active region and having a first surface facing a frontside surface of the substrate; and a vertical gate portion filling the cutout space and having a second surface facing a fin sidewall, among a plurality of fin sidewalls of the asymmetric fin region, and a third surface at a vertical level lower than a vertical level of the frontside surface of the substrate;

a source region and a drain region formed in the active region, the source region being formed on a first side of the gate electrode and the drain region formed on a second side of the gate electrode opposite to the first side; and a gate dielectric layer provided between the active region and the gate electrode, the gate dielectric layer comprising portions in contact with the third surface of the vertical gate portion and the fin sidewall, and wherein a first distance from the asymmetric fin region to the source region in the channel direction in the active region is smaller than a second distance from the asymmetric fin region to the drain region in the channel direction.

13. The image sensor of claim 12, further comprising a photodiode formed in the substrate, wherein the cutout space and the asymmetric fin region overlap the photodiode in a vertical direction.

14. The image sensor of claim 12, wherein the asymmetric fin region of the active region is provided in a position shifted from a center of the active region to an edge side of the active region in a direction perpendicular to the channel direction in the active region.

15. The image sensor of claim 12, wherein an uppermost surface of the active region has a variable width in the channel direction in the active region, and the width of the uppermost surface of the active region is the smallest in the asymmetric fin region.

16. The image sensor of claim 12, wherein:

the active region has a rectangular planar shape such that a length of the active region in a first horizontal direction is longer than a width of the active region in a second horizontal direction perpendicular to the first horizontal direction, the source region is provided at one end of the active region in the first horizontal direction, and the drain region is provided at another end of the active region in the first horizontal direction.

17. The image sensor of claim 12, wherein:

the active region has an L-shaped planar shape comprising a bent portion, the source follower transistor is configured such that a channel is formed in a direction bent along the planar shape of the active region, the source region is provided at one end of the active region, the drain region is provided at another end of the active region, and the horizontal gate portion of the gate electrode is provided on the bent portion of the active region, and the vertical gate portion of the gate electrode is horizontally spaced apart from the bent portion of the active region.

18. The image sensor of claim 12, wherein the source follower transistor comprises a dual transistor in which two local transistors sharing the source region are connected in parallel, the drain region comprises a first drain region provided at one end of the active region, and a second drain region provided at the other end of the active region, and the asymmetric fin region comprises a first asymmetric fin region provided in a first position closer to the source region between the source region and the first drain region, and a second asymmetric fin region provided in a second position closer to the source region between the source region and the second drain region.

19. The image sensor of claim 12, wherein:

the source follower transistor comprises a dual transistor in which two local transistors sharing the source region are connected in parallel, the active region has an L-shaped planar shape comprises a bent portion, the source region is provided in the bent portion of the active region;

the drain region comprises a first drain region provided at one end of the active region, and a second drain region provided at another end of the active region, and the asymmetric fin region comprises:

a first asymmetric fin region provided in a first position closer to the source region than the first drain region between the source region and the first drain region, and a second asymmetric fin region provided in a second position closer to the source region than the second drain region between the source region and the second drain region.

20. An electronic system comprising:

at least one camera including an image sensor; and a processor configured to process image data received from the at least one camera, wherein the image sensor comprises:

a substrate having a pixel region;

an active region provided in the pixel region, the active region having an edge portion in a direction perpendicular to a channel direction in the active region, and the active region having an asymmetric fin region configured by a cutout space at the edge portion of the active region and shifted from a center of the active region; and a transistor provided in the pixel region, wherein the transistor comprises:

a gate electrode comprising a horizontal gate portion provided on the active region and having a first surface facing an upper surface of the active region, and a vertical gate portion filling the cutout space and having a second surface facing a fin sidewall among a plurality of fin sidewalls of the asymmetric fin region;

a source region and a drain region formed in the active region, the source region being formed on a first side of the gate electrode and the drain region formed on a second side of the gate electrode opposite to the first side; and a gate dielectric layer between the active region and the gate electrode, and wherein a first distance between the source region and the asymmetric fin region is different from a second distance between the drain region and the asymmetric fin region.

* * * * *